(12) United States Patent
Bachmann et al.

(10) Patent No.: US 7,342,314 B2
(45) Date of Patent: Mar. 11, 2008

(54) DEVICE HAVING A USEFUL STRUCTURE AND AN AUXILIARY STRUCTURE

(75) Inventors: Jens Bachmann, Dresden (DE); Klaus Goller, Dresden (DE); Dirk Grueneberg, Dresden (DE); Reiner Schwab, Hausham (DE)

(73) Assignee: Infineon Technologies AG, Munich (DE)

( * ) Notice: Subject to any disclaimer, the term of this patent is extended or adjusted under 35 U.S.C. 154(b) by 234 days.

(21) Appl. No.: 10/865,507

(22) Filed: Jun. 10, 2004

(65) Prior Publication Data

US 2005/0017328 A1 Jan. 27, 2005

(30) Foreign Application Priority Data

Jun. 10, 2003 (DE) ................. 103 26 087

(51) Int. Cl.
H01L 23/48 (2006.01)
H01L 23/52 (2006.01)
H01L 29/40 (2006.01)
H01L 27/108 (2006.01)
H01L 29/76 (2006.01)

(52) U.S. Cl. ............... 257/758; 257/211; 257/296; 257/298; 257/300; 257/307; 257/308; 257/309; 257/312; 257/313; 257/532; 257/534; 257/535; 257/759; 257/760

(58) Field of Classification Search ............... 257/532, 257/534, 211, 296, 298, 300, 307–309, 312–313, 257/535, 758–760
See application file for complete search history.

(56) References Cited

U.S. PATENT DOCUMENTS 3,714,613 A * 1/1973 Appleton .................. 337/295
4,283,733 A * 8/1981 Aomura ..................... 257/754
4,535,384 A * 8/1985 Wakabayashi et al. ...... 361/718
4,862,474 A * 8/1989 Morinaga et al. .......... 372/50.1
5,390,078 A * 2/1995 Taylor ....................... 361/721
5,583,359 A   12/1996 Ng et al. .................... 257/306
5,705,854 A * 1/1998 Atarashi et al. ............ 257/721
5,939,766 A * 8/1999 Stolmeijer et al. ......... 257/534
5,981,310 A * 11/1999 DiGiacomo et al. ........ 438/106
6,329,738 B1 * 12/2001 Hung et al. ................ 310/309
6,512,259 B1 * 1/2003 Lange et al. ................ 257/306
6,664,706 B1 * 12/2003 Hung et al. ................ 310/309
6,917,259 B2 * 7/2005 Hirabayashi ................ 333/105
6,958,509 B2 * 10/2005 Korner et al. .............. 257/306
6,963,101 B2 * 11/2005 Weimer et al. ............. 257/306

(Continued)

FOREIGN PATENT DOCUMENTS

EP   1 251 559 A2   10/2002

*Primary Examiner*—Ida M. Soward
(74) *Attorney, Agent, or Firm*—Maginot, Moore & Beck

(57) ABSTRACT

The present invention provides a device having a useful structure which is arranged on a substrate and has a useful structure side edge. In addition, an auxiliary structure is arranged on the substrate adjacent to the useful structure, the auxiliary structure having an auxiliary structure side edge, wherein the useful structure side edge is opposite to the auxiliary structure side edge separated by a distance, and wherein the auxiliary structure useful structure distance is dimensioned such that a form of the useful structure side edge or a form of the substrate next to the useful structure side edge differs from a form in a device where there is no auxiliary structure.

21 Claims, 26 Drawing Sheets

U.S. PATENT DOCUMENTS

2003/0087167 A1* 5/2003 Popp .............................. 430/5
2003/0205824 A1* 11/2003 Kim et al. ................. 257/774
2004/0014308 A1* 1/2004 Kellar et al. ................ 438/612
2004/0142540 A1* 7/2004 Kellar et al. ................ 438/455

* cited by examiner

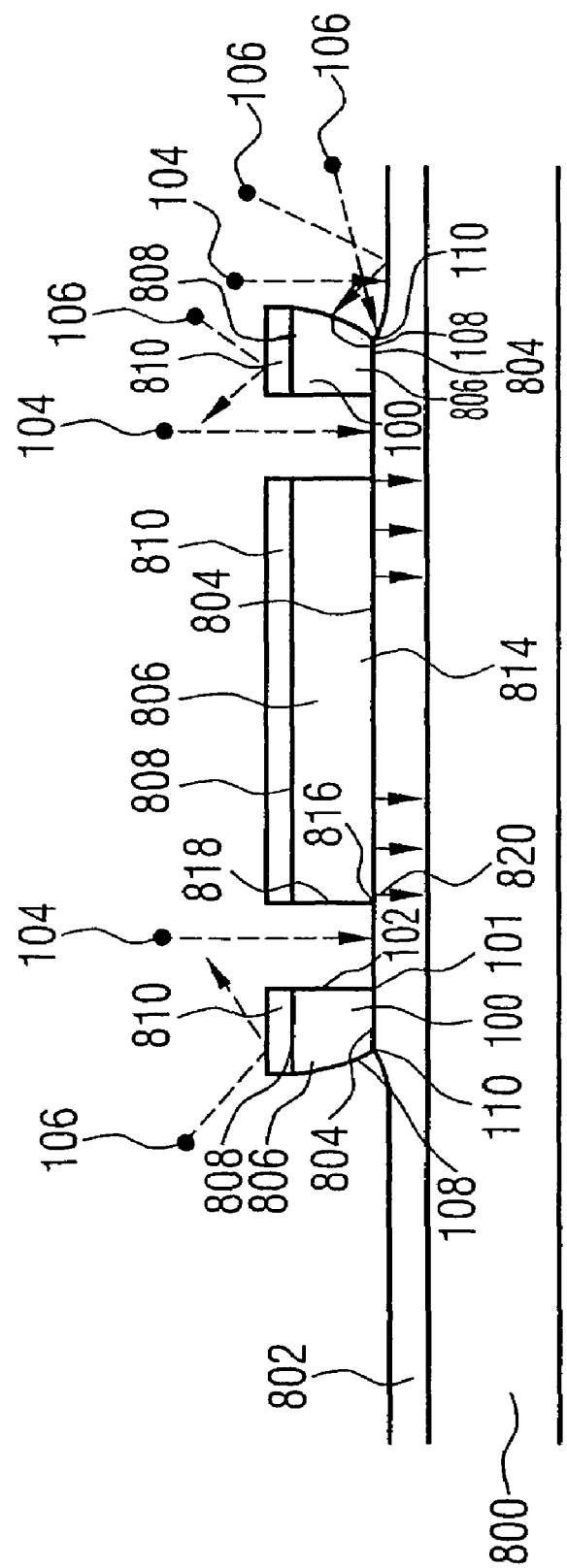

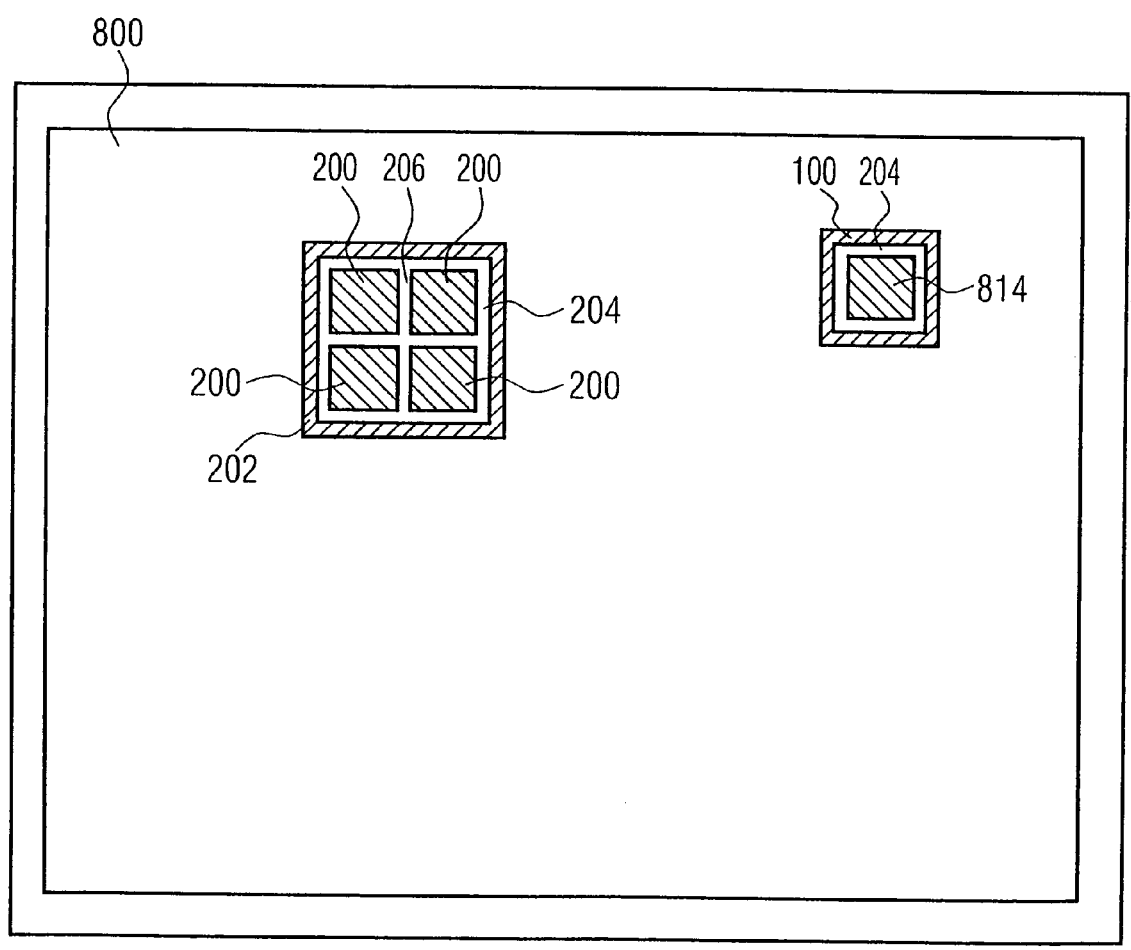

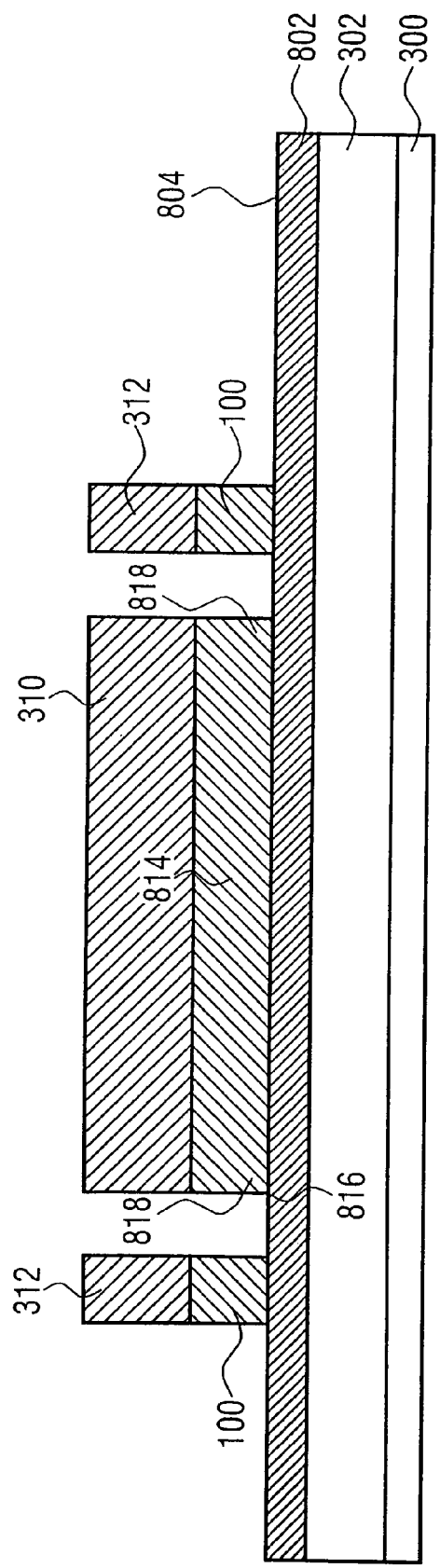

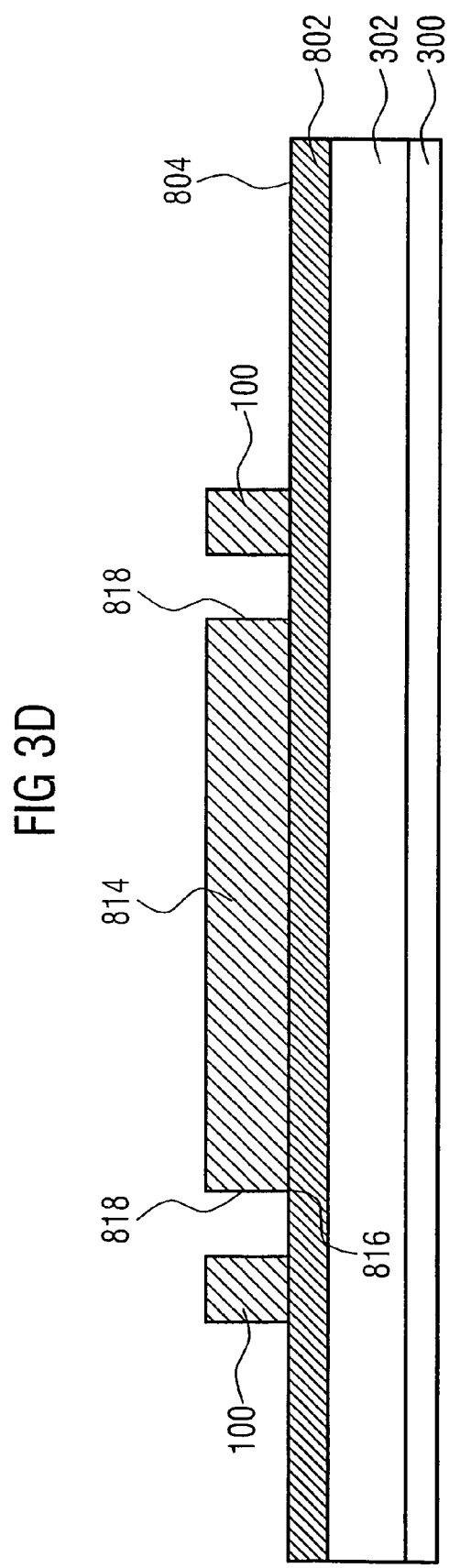

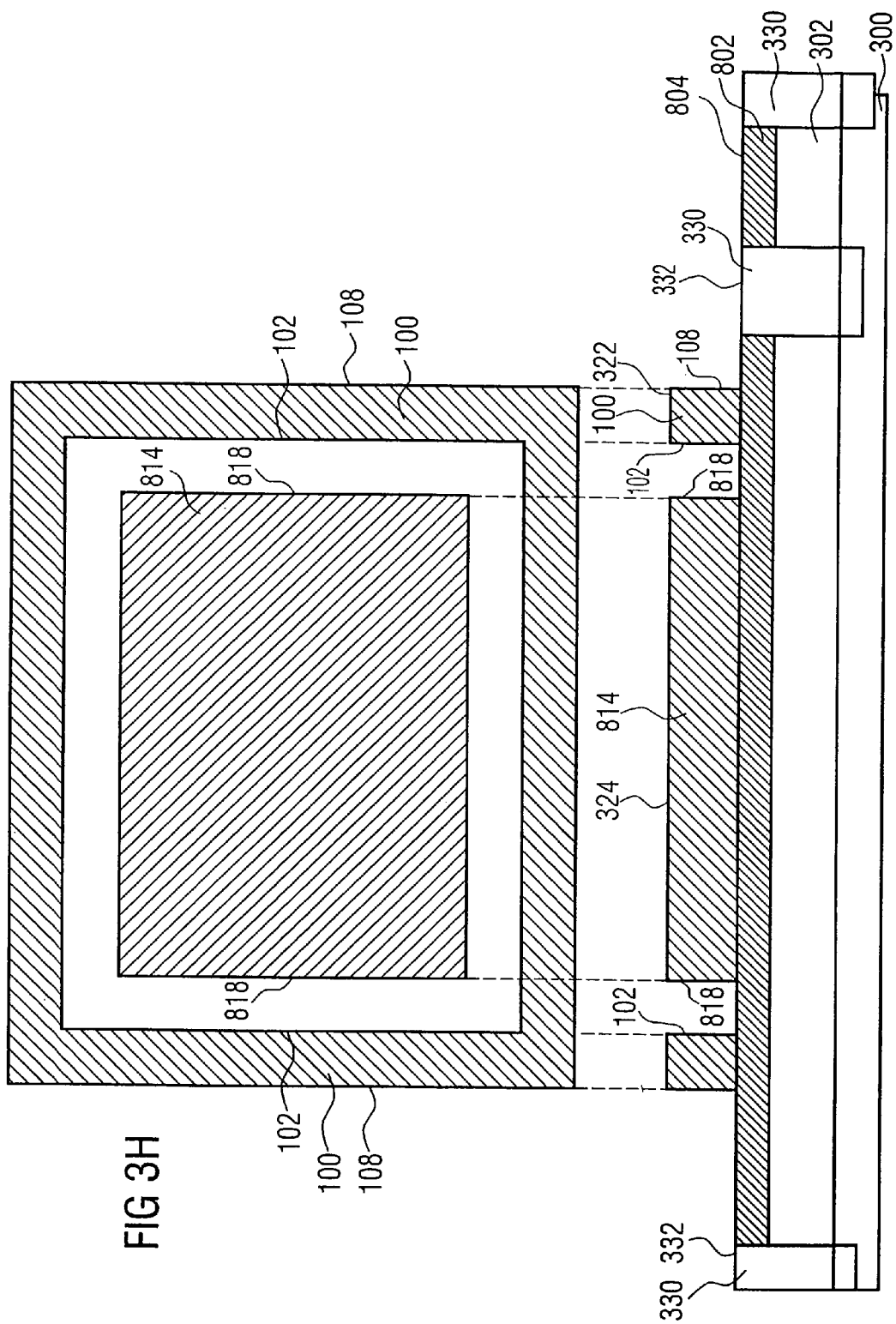

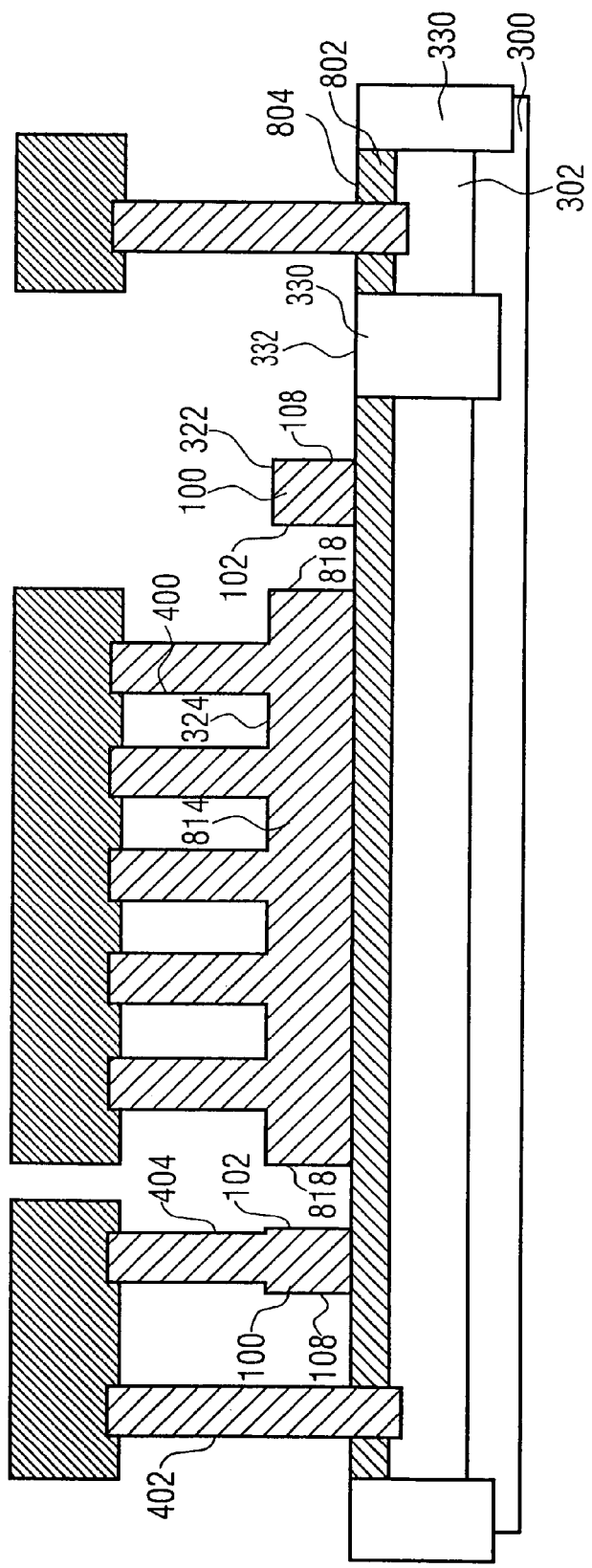

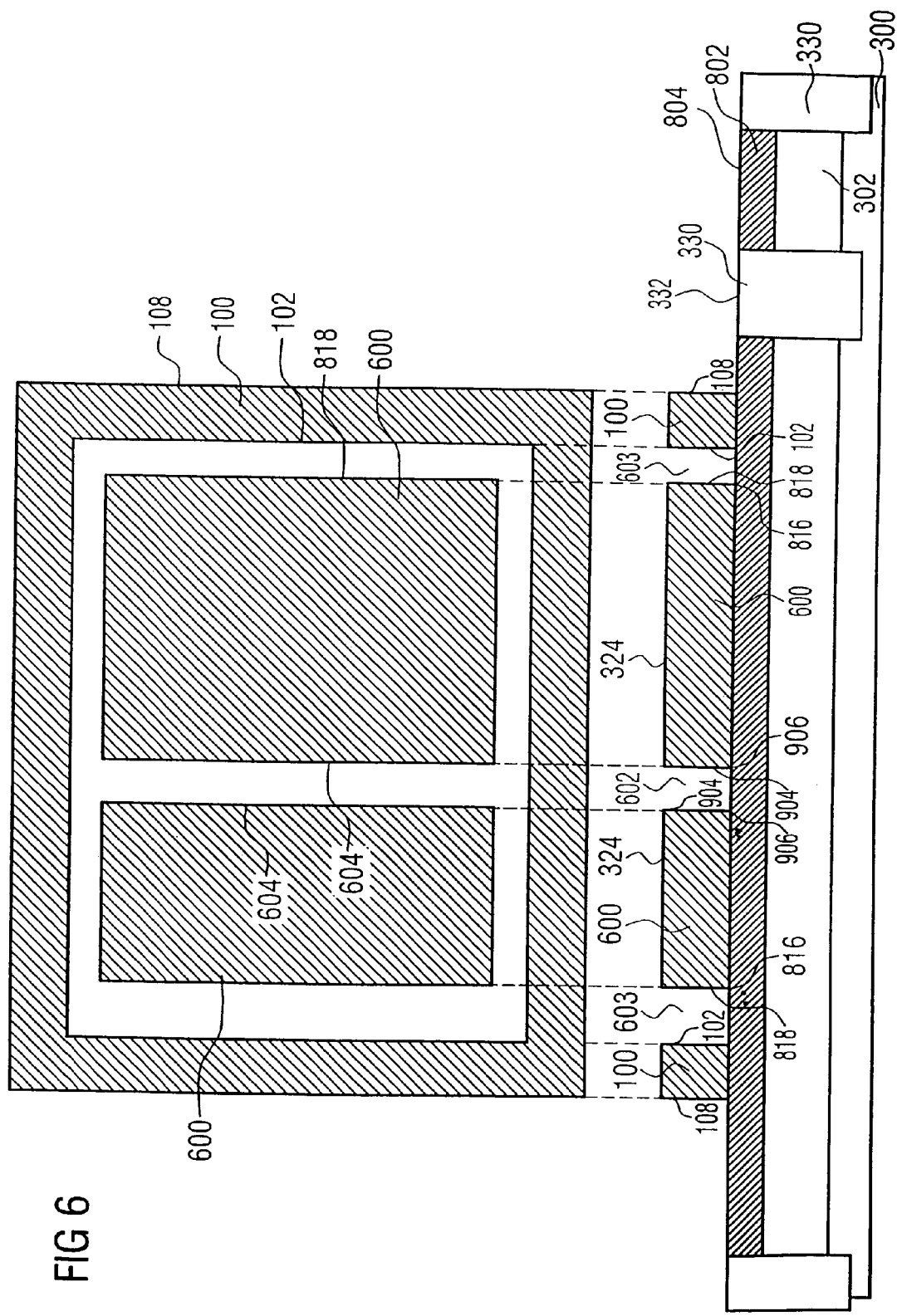

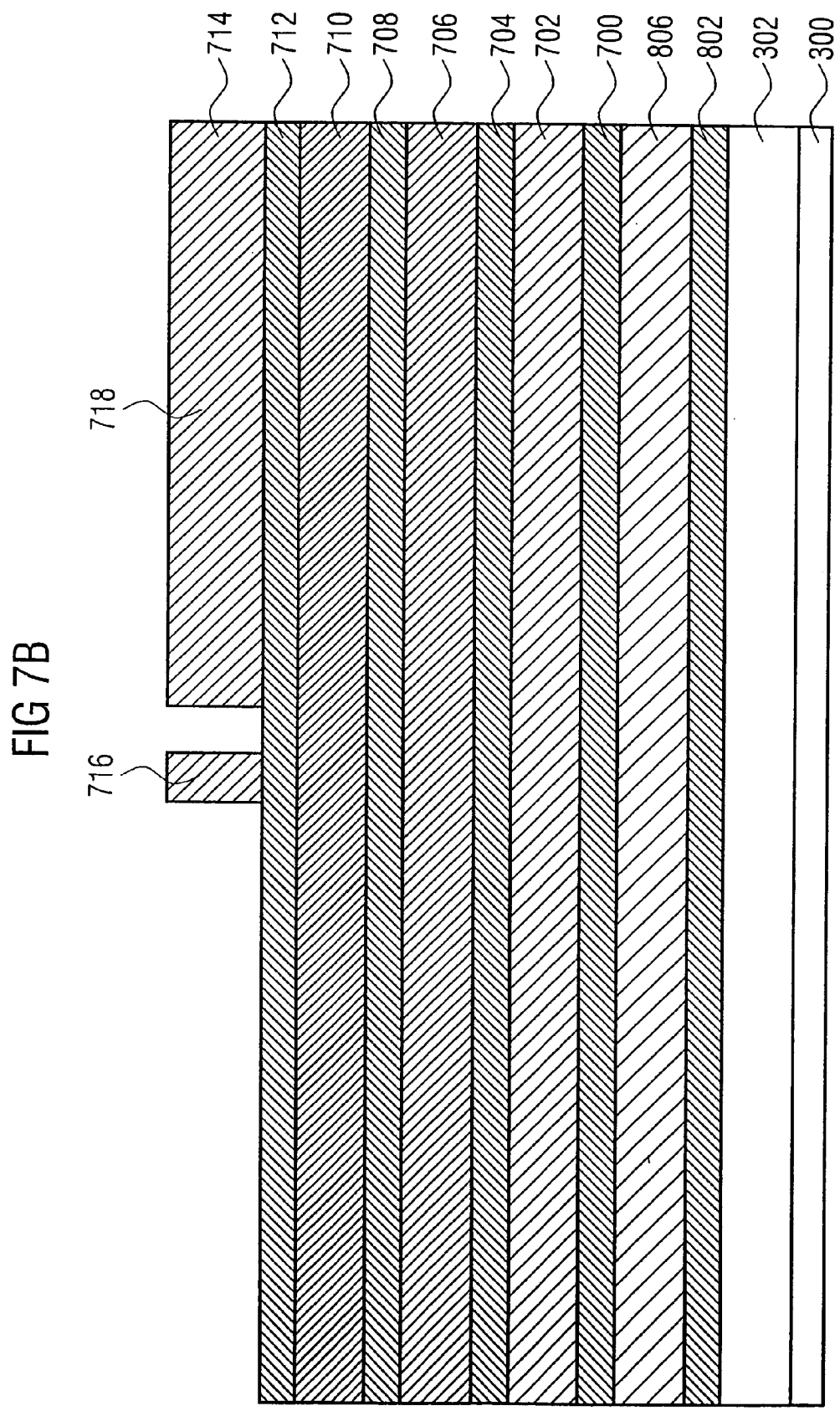

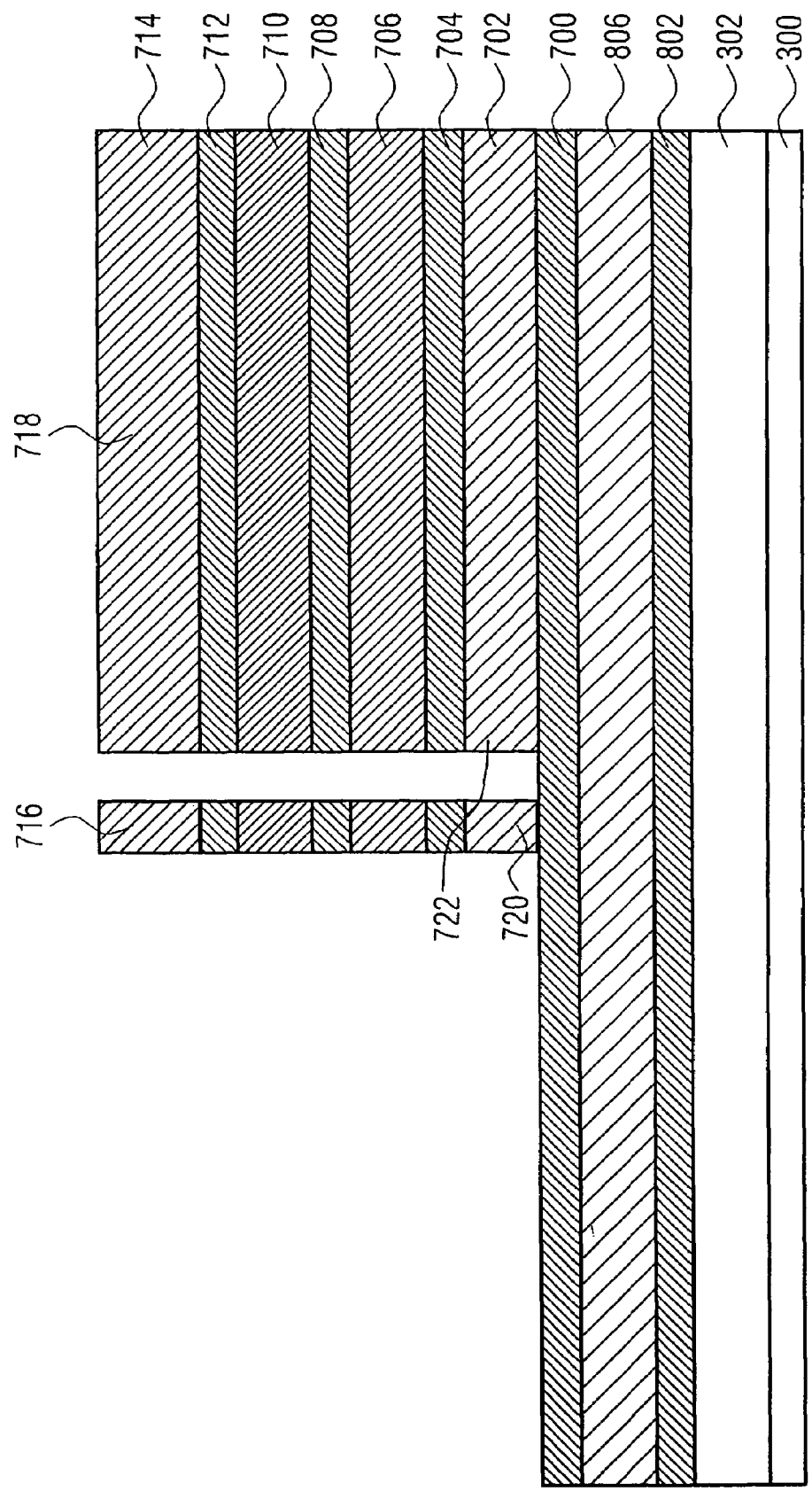

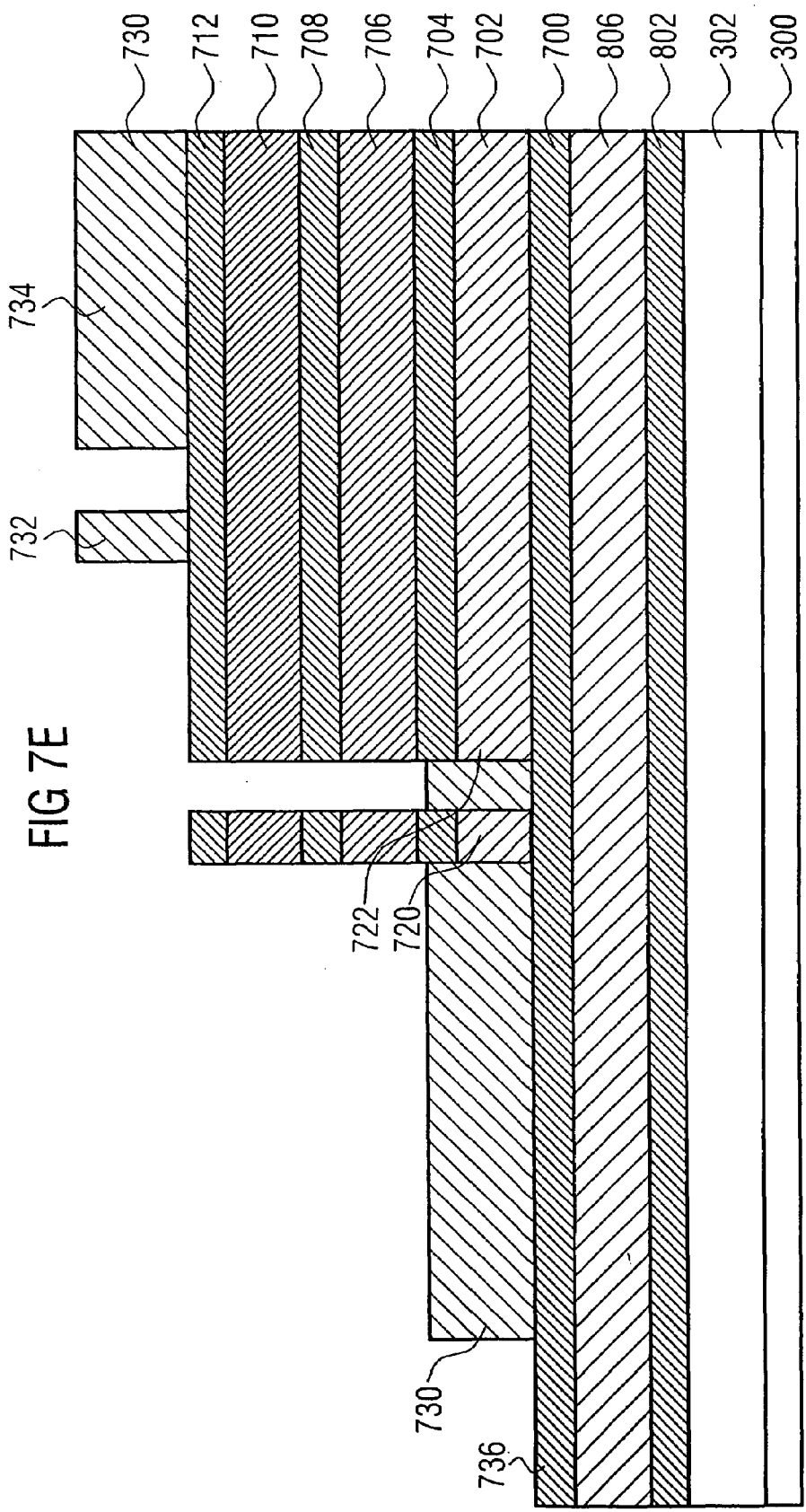

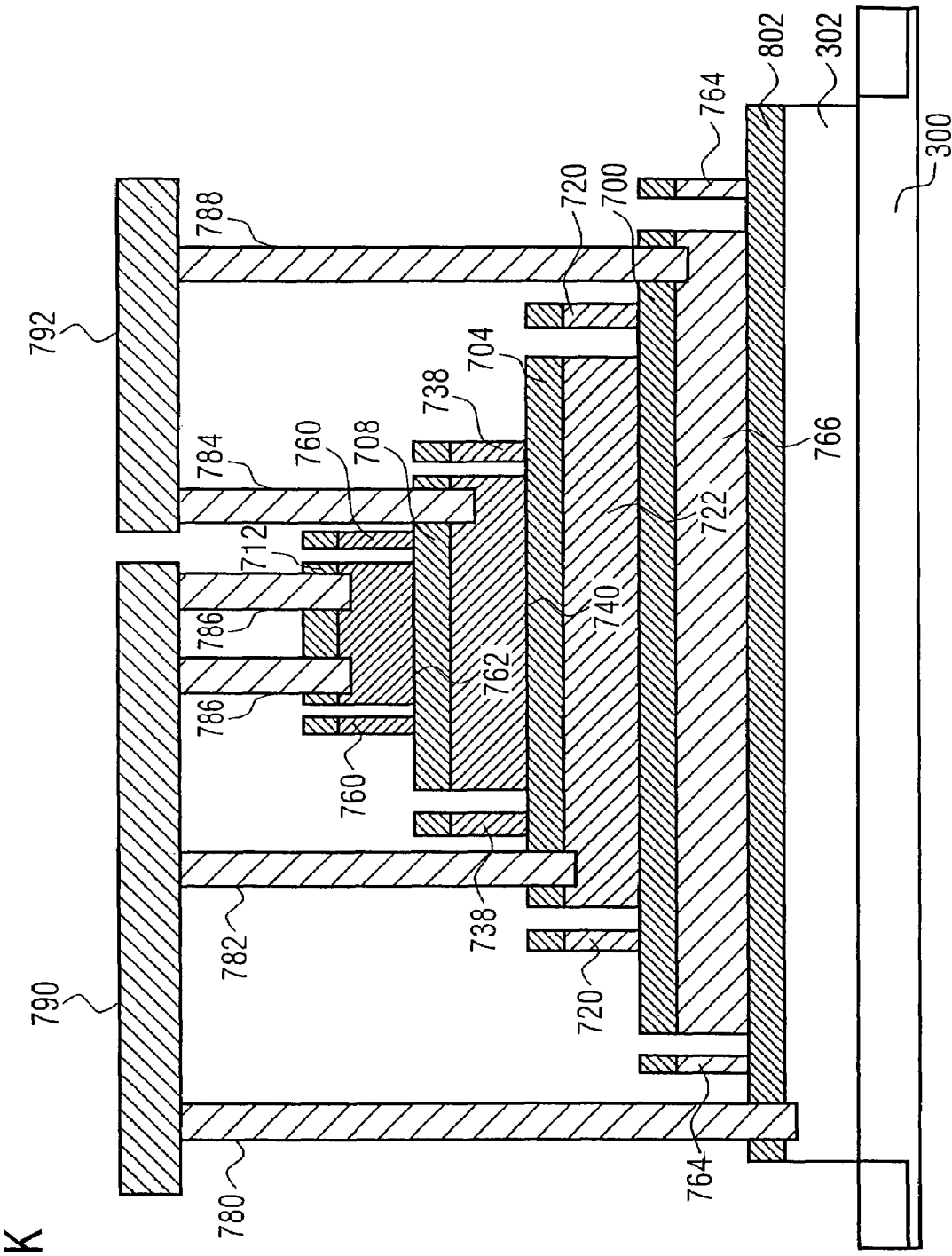

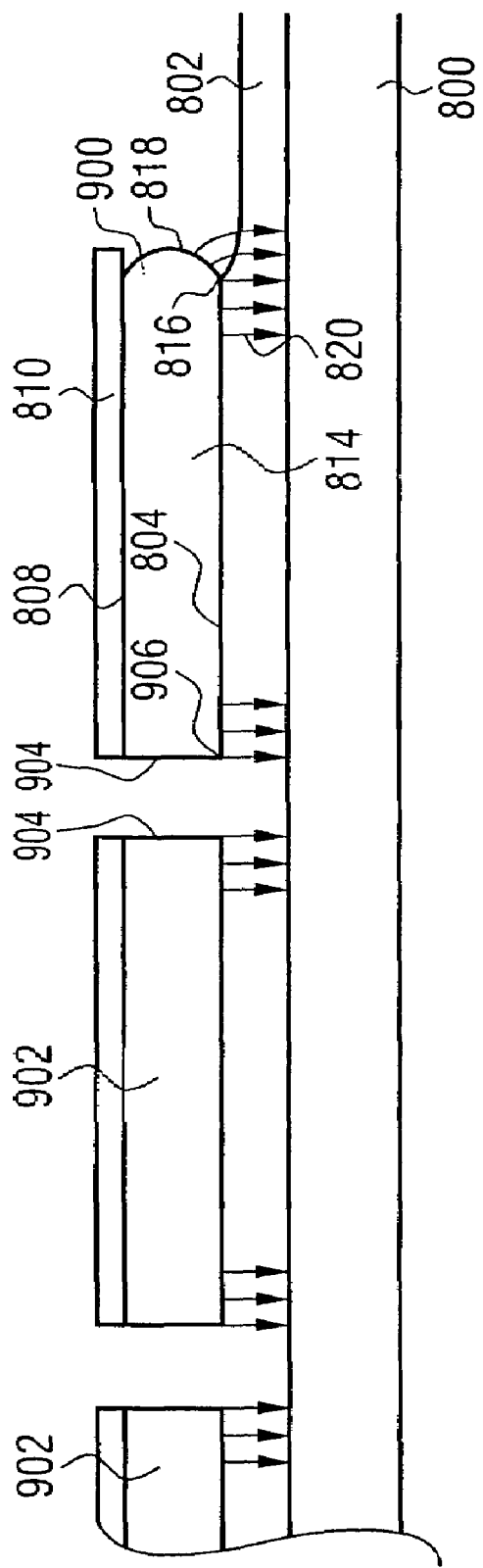

DEVICE HAVING A USEFUL STRUCTURE AND AN AUXILIARY STRUCTURE

BACKGROUND OF THE INVENTION

1. Field of the Invention

The present invention relates to an electronic device and, in particular, to an electronic device in integrated technology.

2. Description of Related Art

In order to form a device in integrated technology, a process step in which an etching process takes place is often performed when manufacturing a device. An etching process can, in general, be characterized by the fact that the surface of a solid body is eroded during this process using an etchant, wherein the etchant includes chemical reagents and/or particles having a high kinetic energy. The etching rate of an etchant is also depends on the material to be etched and on a possible dopant concentration of the solid body. Because an etchant has different etching rates regarding the material to be etched, a selectivity of the etchant forms regarding a material to be etched compared to another material. This material can, for example, have a masking or protecting function. In addition, the etching rate of an etchant can depend on the etching direction (anisotropic etching).

In principle, etching methods can be divided into chemical, chemical-physical and physical etching methods. While chemical, in particular wet-chemical, etching methods have a high selectivity regarding the medium to be etched and a high anisotropy regarding the crystal orientation, it can be noted that in these etching methods an irregular etching process takes place, for example by the formation of gas bubbles, and additionally under-etching occurs by a poorly directed etching behavior of the etchant in the material to be etched. For this reason, wet-chemical etching methods only have a low resolution ability, which is why the manufacture of devices having small dimensions is problematic with this etching method. Physical etching methods (such as, e.g., the sputter etching method or the ion beam etching method), in contrast possess considerably better dissolution qualities since, in these methods, the particles of the etching medium (such as, e.g., electrons or ions) are accelerated and impinge on the medium to be etched in a directed way. A high anisotropy of the etching process can be achieved by this, whereby a high dissolution ability can be realized, which proves to be of advantage for manufacturing devices having small dimensions. By virtue of the partly high kinetic energy of the particles of the etching medium, a lower selectivity of the etching medium regarding the material to be etched is, however, obtained in physical etching methods, compared to chemical etching methods since the etching effect basically results from knocking out components of the material to be etched. In particular, a non-selective etching behavior is of high disadvantage when areas of the device essential for a fault-free functionality of the device are damaged by the etching process. Damage resulting from a physical etching method employed in insulation or dielectric layers which are arranged below the material to be removed by the etching can be mentioned as an example. In particular damage by thinning the insulation or dielectric layers mentioned can be observed. Since the insulation or dielectric layer mentioned considerably determines the behavior of a device to be formed (in particular of a capacitive device), attention must be paid to not damaging such layers when manufacturing the device.

In order to achieve a high dissolution and, at the same time, a high selectivity when manufacturing a device having small dimensions, a plasma etching method is often employed. Gasses activated by plasma and reactive gasses are used for the etching process. The activation of the gasses thus mostly takes place by thermal and high-frequency electromagnetic excitation. The plasma etching method thus represents a chemical-physical etching method which basically combines the advantages of a purely chemical etching method and the advantages of a purely physical etching method.

The plasma etching method does, however, also have some disadvantages apart from the advantages. It is to be mentioned here in particular that kinetic energy is supplied to the particles of the etching medium by thermal or high-frequency electromagnetic excitation of the etching medium, but the formation of a preferred direction of movement (i.e. the formation of a directivity) often does not take place. Effects exemplarily illustrated in FIG. 8 are caused by this.

Firstly, FIG. 8 shows a substrate 800 comprising an upper layer 802 which, for example, includes an insulating or dielectric material. A starting layer 806 which, for example, includes a conductive material, is deposited on the surface 804 of the upper layer 802. In order to form a device, a covering layer 810 is deposited on the surface 808 of the starting layer 806 and patterned in such a way that the area of the starting layer 806 to be removed is exposed. By a subsequent etching process, in particular a plasma etching process, the areas of the starting layer 806 exposed by the patterned covering layer 810 are removed so that the result is a useful structure 814. When an upper electrode of a metal isolator metal capacity (MIMCAP) is, for example, formed by the useful structure 814 in combination with the insulating upper layer 802 and the (preferably conductive) substrate 800, the etching medium used in the etching process should, in the ideal case, be highly selective regarding the material of the upper layer 802. This means that the upper layer 802 (such as, e.g., an insulating layer or a dielectric) should not be damaged at the etching edge 816 of the useful structure 814 since an undesired electric behavior results otherwise.

In practice, it shows, however, that the upper layer 802, i.e. the insulation layer or the dielectric, is damaged by applying a plasma etching method for forming the useful structure 814. In addition, the side edges 818 of the useful structure (such as, e.g., the side edges of the upper electrode of an MIMCAP) are under-etched by the plasma etching method, as in shown in FIG. 8. Inhomogeneities of the electric field between the useful structure 814 and the substrate 800 are caused by this, in particular at the etching edges 816 of the useful structure 814, as is exemplarily shown in FIG. 8 with the help of the field lines 820 of the electric field illustrated.

Basically, the damage of the upper layer 802 and the under-etching of the etching edge 816 result from an isotropic etching caused by a lacking directivity of the particles 822 of the etching medium perpendicularly to the upper layer 802.

Furthermore, margin structures, i.e. useful structures at the margins of a field of several useful structures (such as, e.g., of an MIMCAP field) are affected more strongly than useful structures within the useful structure field. Such a case is illustrated in FIG. 9 in which a margin structure 900 is arranged at the margin of a field of several useful structures 902 within the field. In particular, it can be seen that the useful structure side edges 904 and the etching edges 906 lying within the field of the useful structures 902 are not damaged to such an extent by the isotropic plasma etching as the useful structure side edges 818 and etching edges 816 arranged at the margin regions.

Apart from the lacking directivity of the particles 822 of the etching medium mentioned above, such an effect results from the differing saturation behavior of the etching medium while etching useful structure side edges 902 within a useful structure field compared to etching useful structure side edges 818 at the outer margin of the useful structure field. In particular due to the fact that a useful structure side edge 904 opposite to the useful structure side edge 904 is formed at the same time within a useful structure field while etching a useful structure side edge 904, a saturation effect of the reactivity of the particles 822 of the etching medium occurs since in such a case firstly a considerably larger surface is to be etched with basically the same amount of etching medium in the environment of the useful structure side edge 904 to be etched, compared to a useful structure side edge 818 arranged at the margin region of a useful structure field, and secondly a geometrical arrangement is to be realized by forming a gap between the two opposing useful structure side edges 904 within a useful structure field, the arrangement having less favorable features for a fast diffusion of the particles 822 of the etching medium consumed by the etching process away from the material to be etched, than is the case for outer useful structure side edges 818 at the margin region of a useful structure field. By such an etching process, useful structure side edges 904 can be generated within a useful structure field, which, compared to outer useful structure side edges 818 of a margin structure 900, have considerably less under-etching of the etching edges and a considerably smaller damage of the upper layer 802.

It has proved to be of particular disadvantage that, by damaging the upper layer 802 (such as, e.g., the insulation layer or the dielectric), the etching attack, the lifetime and the dielectric strength of the devices formed, compared to undamaged devices, are reduced, which results in an increase of the defect density and of the early failure rate. In addition, the electrical behavior of the margin structure 900 is impeded by damaging the upper layer 802 and under-etching the etching edge 816, respectively, which results in a sometimes considerable deviation of the device value from the expected device value.

SUMMARY OF THE INVENTION

It is the object of the present invention to provide a device having a longer lifetime, a higher dielectric strength, a decreased defect density and an electrical behavior which can be adjusted more reliably.

In accordance with a first aspect, the present invention provides a device having: a useful structure arranged on a substrate and having a useful structure side edge; and an auxiliary structure arranged on the substrate adjacent to the useful structure and having an auxiliary structure side edge, wherein the useful structure side edge is opposite to the auxiliary structure side edge separated by a distance, and wherein the auxiliary structure useful structure distance is dimensioned in such a way that a form of the useful structure side edge or a form of the substrate next to the useful structure side edge differs from a form in a device in which there is no auxiliary structure.

In accordance with a second aspect, the present invention provides a method of manufacturing a device, starting from a substrate on which a starting layer for forming a useful structure and an auxiliary structure is arranged, having the following step: patterning the starting layer to obtain the useful structure and the auxiliary structure, wherein the step of patterning is performed such that after patterning, the useful structure has a useful structure side edge and the auxiliary structure has an auxiliary structure side edge, wherein the useful structure side edge is opposite to the auxiliary structure side edge separated by a distance, and wherein the auxiliary structure useful structure distance is dimensioned such that a form of the useful structure side edge or a form of the substrate next to the useful structure side edge differs from a form in a device in which there is no auxiliary structure.

The present invention provides a device including a useful structure arranged on a substrate and comprising a useful structure side edge, and an auxiliary structure arranged adjacent to the useful structure on the substrate and comprising an auxiliary structure side edge, wherein the useful structure side edge is opposite to the auxiliary structure side edge in a way separated by a distance, and wherein the auxiliary structure useful structure distance is sized such that a form of the useful structure side edge or a form of the substrate next to the useful structure side edge differs from a form in a device where there is no auxiliary structure.

The present invention is based on the finding that a damage of the insulation or dielectric layer and an under-etching of the useful structure side edge are reduced by arranging an auxiliary structure next to the etching edge to be protected and the useful structure side edge to be protected. By arranging the auxiliary structure in a distance opposite to a useful structure side edge to be protected and an etching edge to be protected, a more anisotropic etching behavior of the etching medium can be realized than could be realized without arranging the auxiliary structure. A preferred direction of the particles of the etching medium excitated by the plasma, incident on the material to be etched can be adjusted in particular by the width of the distance between the useful structure and the auxiliary structure. An advantage of the inventive approach is that by selecting the distance of the auxiliary structure to the useful structure firstly the incident direction of the particles of the etching medium is controlled such that a damage of the insulation layer or the dielectric and an under-etching of the etching edges of outer useful structure side edges are minimized and that, secondly, a saturation effect can be adjusted in the etching process of the outer useful structure side edges. A longer lifetime, a higher dielectric strength, a smaller defect density and an electrical behavior of the device which can be adjusted more reliably can be achieved by this.

According to a preferred embodiment of the present invention, a plurality of useful structures having useful structure side edges are arranged on the substrate, wherein two useful structures of the plurality of useful structures are adjacent via a useful structure distance between the useful structure side edges of them, and wherein the distance between the useful structure side edge and the auxiliary structure side edge, within a predetermined tolerance range, is the same around the useful structure distance.

According to another preferred embodiment of the invention, the tolerance range includes a deviation of typically 10% of the useful structure distance.

According to another preferred embodiment of the present invention, the plurality of useful structures forms a field of useful structures, wherein the useful structure opposite to which the auxiliary structure is arranged, is arranged at a margin of the field of useful structures.

According to another preferred embodiment of the present invention, the plurality of the useful structures are arranged on the substrate at different locations, wherein the auxiliary structures are adjacent via the distance to the useful structures and the distance, within a tolerance range, is the same at all locations.

According to another preferred embodiment of the present invention, the auxiliary structure surrounds the useful structure or the field of useful structures.

According to another preferred embodiment of the present invention, the auxiliary structure has an auxiliary structure height and the useful structure has a useful structure height, wherein the auxiliary structure height, within a tolerance range, equals the useful structure height.

According to another preferred embodiment of the present invention, the tolerance range of the auxiliary structure height includes a deviation of maximally 10% of the useful structure height.

According to another preferred embodiment of the present invention, the substrate includes an upper layer on which the useful structure and the auxiliary structure are arranged.

According to another preferred embodiment of the present invention, the upper layer of the substrate includes a dielectric.

According to another preferred embodiment of the present invention, the useful structure comprises an electric functionality having a useful characteristic.

According to another preferred embodiment of the present invention, the substrate comprises a metal area and an insulating layer on the metal area, wherein the useful structure and the auxiliary structure are arranged on the insulating layer and include a metallic material so that the useful structure, the insulating layer and the metal area form a metal isolator metal capacitor.

According to another preferred embodiment of the present invention, the auxiliary structure is conductive and comprises a terminal contact for providing the auxiliary structure with a potential.

According to another preferred embodiment of the present invention, the auxiliary structure is connected to the metal area in an electrically conductive way.

According to another preferred embodiment of the present invention, another auxiliary structure is adjacent to the auxiliary structure, wherein the distance between the auxiliary structure and the other auxiliary structure, within a tolerance range, corresponds to the auxiliary structure useful structure distance.

According to another preferred embodiment of the present invention, the tolerance range between the auxiliary structure and the other auxiliary structure includes a deviation of 10% of the auxiliary structure useful structure distance.

According to another preferred embodiment of the present invention, a plurality of useful structures and auxiliary structures arranged adjacent thereto are arranged on the substrate in a plurality of sheets, wherein a sheet includes a support layer, a useful structure and an auxiliary structure arranged adjacent to the useful structure, wherein the useful structure and the auxiliary structure are deposited on the support layer.

According to another preferred embodiment of the present invention, the material of the support layer includes an insulating material.

The present invention further provides a method of manufacturing a device, starting from a substrate on which a starting material for forming a useful structure and an auxiliary structure is arranged, comprising the following step:

patterning the starting layer to obtain the useful structure and the auxiliary structure, wherein the step of patterning is performed such that, after patterning, the useful structure comprises a useful structure side edge and the auxiliary structure comprises an auxiliary structure side edge, wherein the useful structure side edge is opposite to the auxiliary structure side edge separated by a distance, and wherein the auxiliary structure useful structure distance is sized such that a form of the useful structure side edge or a form of the substrate next to the useful structure side edge differs from a form in a device where there is no auxiliary structure.

According to a preferred embodiment of the present invention, the patterning of the starting layer, at first, includes depositing a covering layer on the starting layer, which is followed by patterning the covering layer to produce a mask by which the useful structure and the auxiliary structure are defined, which is followed by patterning the starting layer using the mask produced to form the useful structure and the auxiliary structure.

According to another preferred embodiment of the present invention, the patterning of the starting layer takes place by a dry etching method.

According to another preferred embodiment of the present invention, the patterning of the starting layer takes place by a plasma etching method.

BRIEF DESCRIPTION OF THE DRAWINGS

Preferred embodiments of the present invention will be detailed subsequently referring to the appendage drawings, in which:

FIG. 1 shows a first preferred embodiment of an inventive device in a sectional view, wherein the operating mode of the auxiliary structure during the etching process is illustrated exemplarily at the same;

FIG. 2 shows a second preferred embodiment of the inventive device in a plan view;

FIG. 4 shows a third preferred embodiment of the inventive device in a sectional view;

FIG. 6 shows a fifth preferred embodiment of the inventive device in a sectional view;

FIGS. 7A to 7K show a second preferred embodiment of the inventive manufacturing method in a sectional view;

FIG. 9 shows a plurality of devices manufactured according to a method according to the prior art in a sectional view.

Figure 3A:
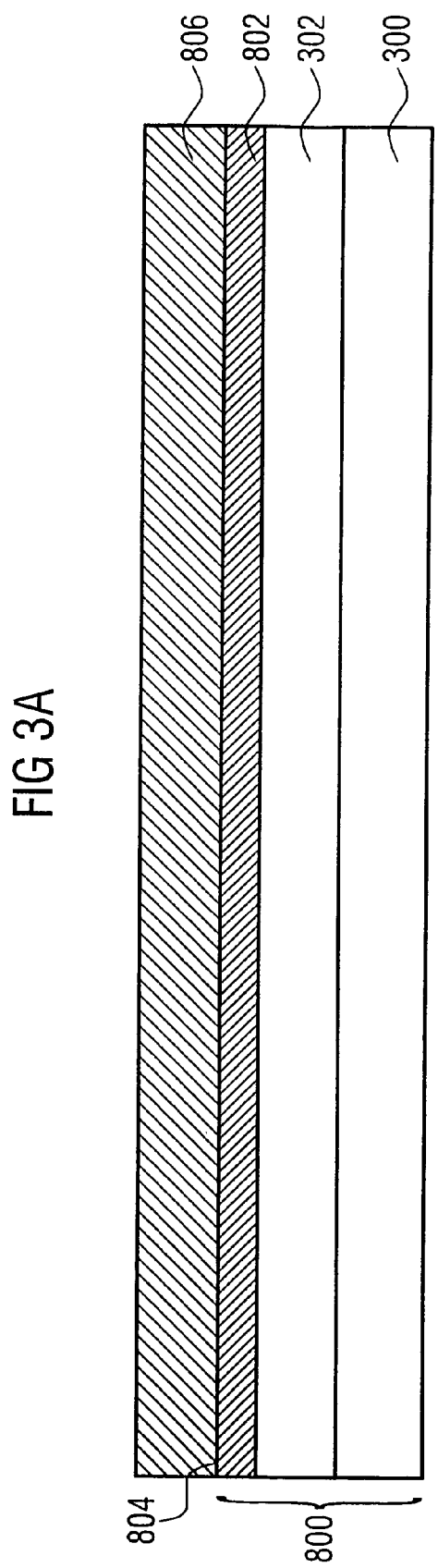
FIG. 3 shows a first preferred embodiment of the inventive manufacturing method in a sectional view.

DESCRIPTION OF PREFERRED
EMBODIMENTS

The same reference numerals will be used throughout the subsequent description of the preferred embodiments of the present invention for elements illustrated in the different drawings and having similar effects.

A first preferred embodiment of the inventive device and the operating mode of it during the etching process will be discussed in greater detail referring to FIG. 1. A substrate 800 is shown in FIG. 1, which includes an upper layer 802, wherein the substrate 800 preferably includes a conductive material, and wherein the upper layer 802 preferably includes an insulating or dielectric material. In addition, a starting layer 806 is arranged on the surface 804 of the upper layer 802. Furthermore, a covering layer 810 (such as, e.g., a photo-sensitive resist) is arranged on a surface 808 of the starting layer 806, the covering layer being patterned in such a way that the useful structure 814 and the auxiliary structure 100 are defined in the starting layer 806 by the patterned covering layer 810. By arranging the auxiliary structure 100, a higher anisotropy of the etching process can be realized in the gap between the auxiliary structure 100 and the useful structure 814. The increase in anisotropy of the etching process is, in particular, achieved by producing a gap by arranging an auxiliary structure side edge 102 in combination with an opposite useful structure side edge 818, wherein a main incident direction of the particles 104 of the etching medium mainly involved in the etching process (such as, e.g., ions, electrons etc.) onto the material to be etched can be adjusted by the width of this gap. By forming a gap between the auxiliary structure side edge 102 and the opposite useful structure side edge 818, it is ensured that particles 106 of the etching medium, the incident direction of which is outside a tolerance range around the main incident direction, are not involved in the etching process to a considerable extent, whereby an under-etching of the etching edge 816 is minimized largely. The tolerance range around the main incident direction here is defined by the distance between the auxiliary structure side edge 102 and the opposite useful structure side edge 818.

In addition, a damage of the upper layer 802 between the auxiliary structure 100 and the useful structure 814 is minimized by arranging the auxiliary structure 100 since during the etching process a saturation effect of the reactivity of the particles 104 of the etching medium mainly involved in the etching process takes place by forming the auxiliary structure side edge 102 which is opposite to the useful structure side 818. This saturation effect results from a decreased diffusion speed of particles 104 of the etching medium consumed by the etching process away from the surface of the material to be etched due to the geometrical arrangement of the auxiliary structure 100 and the useful structure 814 below the gap between the auxiliary structure 100 and the useful structure 814. An increasing saturation effect, i.e. a decreasing reactivity of the particles 104 of the etching medium mainly involved in the etching process can be observed with an increasing depth of the gap between the auxiliary structure 100 and the useful structure 814, whereby, as a consequence, the result is a smaller damage of the upper layer 802 with an increasing depth of the gap between the auxiliary structure 100 and the useful structure 814. For this, an adequate height of the auxiliary structure 100 and the useful structure 814 above the upper layer 802 is required. Preferably, a height of the auxiliary structure 100 and of the useful structure 814 of 80 nm is chosen, whereby an adequate depth of the gap between the auxiliary structure 100 and the useful structure 814 can be adjusted.

By arranging the auxiliary structure 100 in a distance to the useful structure 814, a more homogenous electric field between the useful structure 814 and the conductive substrate arranged below the useful structure is thus produced at the margin area of the useful structure 814, whereby an improved electrical behavior of the device can be adjusted. Such an improved electrical behavior is illustrated in FIG. 1 by a more uniform course of the field lines 820 of the electrical field in the environment of the etching edge 816 in FIG. 1. In addition, by impressing a main incident direction of the particles 104 of the etching medium mainly involved in the etching process, by forming the auxiliary structure 100, the upper layer 802 is damaged to a considerably smaller extent in the surroundings of the etching edge 816 than would be possible without forming the auxiliary structure 100. The lifetime and the dielectric strength of the device which is partly formed by the useful structure 814 are maximized by this.

In addition, those auxiliary structure side edges 108 which are not opposite to a useful structure side edge 818 are, as is shown in FIG. 1, damaged by an isotropic etching process. This damage basically results from an under-etching of the etching edges of the auxiliary structure side edge 108. The under-etching here is mainly caused by those particles 106 of the etching medium having an incident direction on the material to be etched, wherein the incident direction of the particles 106 of the etching medium deviates from the main incident direction by more than a tolerance range.

It can be mentioned as another aspect that no gap is formed due to the lack of a side edge of a useful structure or of an auxiliary structure which is opposite to the outer auxiliary structure side edge 108 and thus a saturation effect of the reactivity of the particles 104 of the etching medium mainly involved in the etching process cannot be observed. The result is a higher diffusion speed of particles 104 of the etching medium consumed by the etching process away from the surface of the material to be etched due to the geometrical arrangement without the auxiliary structure 100. By this, particles of the etching medium not yet consumed reach the surface of the material to be etched faster, which leads to an increased reactivity of the particles of the etching medium and consequently to a stronger damage of the outer auxiliary structure side edge 108, of the outer etching edge 110 of the auxiliary structure and of a region of the upper layer 802 adjacent thereto.

Because the electrical features of the device are basically characterized by the geometrical dimensions of the useful structure 814, wherein the auxiliary structure 100 in the first preferred embodiment illustrated, however, does not directly influence the electrical features of the device, an improvement of the electrical features of the device formed by forming the auxiliary structure 100 during the etching process, is made possible by forming the useful structure 814 more precisely according to the desired dimensions.

FIG. 2 shows a second preferred embodiment of the inventive device in which a useful structure field is formed by a plurality of useful structures 200 on a substrate 800, the useful structure field being enclosed by an auxiliary structure 202. Here, the distance 204 between a useful structure 200 of the useful structure field and the auxiliary structure 202, within a tolerance range, preferably corresponds to the distance 206 between the individual useful structures 200 of the useful structure field. In addition, a useful structure 814 which is enclosed by the auxiliary structure 100 is arranged on the substrate 800. The auxiliary structure 100 again is arranged in a distance 204 to the structure 814, wherein the distance 204, in a tolerance range, corresponds to the distance 206 between the individual useful structures 200 of the useful structure field. The design rules for the manufacturing process of a semiconductor on the wafer level can thus be met, whereby an optimized utilization of the area available on the wafer surface can be realized. Preferably, the distance 206 between the useful structures 200 of the useful structure field includes a range from 0.5 to 2 μm, wherein the distance 204 between the useful structure 200 of the useful structure field and the auxiliary structure 202, in a tolerance range, corresponds to the distance 206 between the useful structures 200 of the useful structure field, wherein the tolerance range corresponds to a deviation of typically 10% of the distance 206 between the individual useful structures 200 of the useful structure field.

A first preferred embodiment of the inventive manufacturing process of a device is discussed in greater detail in FIGS. 3A to 3H. FIG. 3A shows a substrate 800 including a ground layer 300, a first base layer 302 and an upper layer 802, wherein the first base layer 302 is arranged on the ground layer 300 and the upper layer 802 is arranged on the first base layer 302. In addition, the first base layer 302 preferably includes a conductive material, while the upper layer 802 preferably includes an insulating or dielectric material. A starting layer 806 providing the material for the auxiliary and useful structures to be formed is arranged on the surface 804 of the upper layer 802.

Figure 3B:
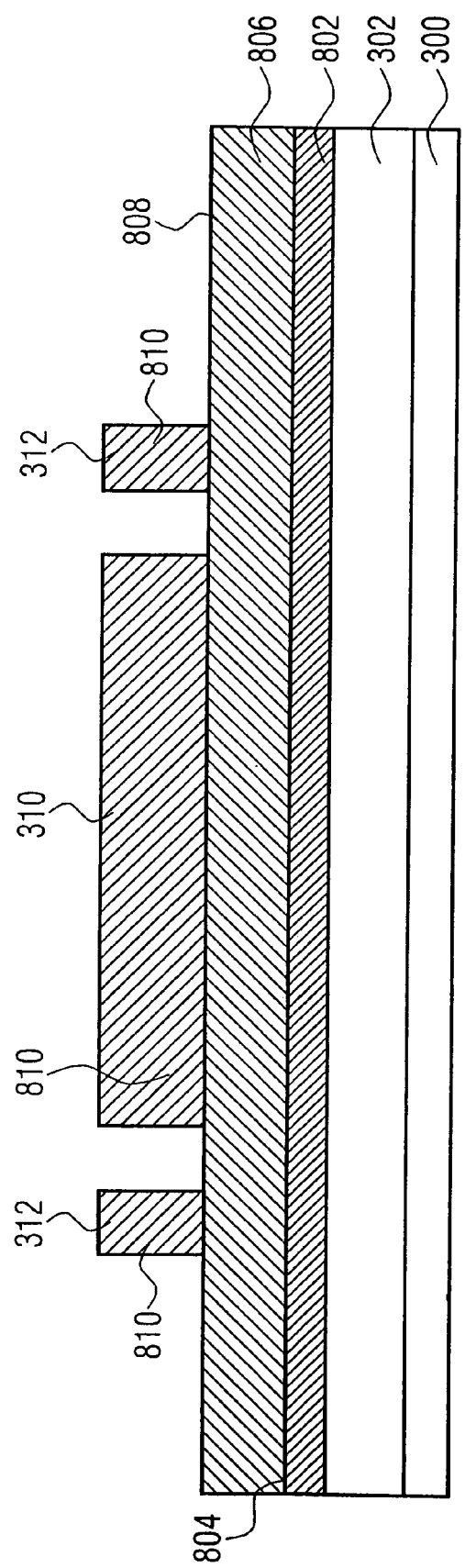

In a subsequent method step, a covering layer 810, such as, for example, a photo-sensitive resist, is deposited on the surface 808 of the starting layer 806 and, for example by using a mask, patterned in such a way that at least a region 310 of the covering layer 810 defines a useful structure to be formed and at least a region 312 of the covering layer 810 defines an auxiliary structure to be formed. The structure resulting after this process step is illustrated in FIG. 3B.

Subsequently, the starting layer 806 is patterned using the region 310 and the region 312 of the patterned covering layer 810 in such a way that, on the surface 804 of the upper layer 802, only the at least one auxiliary structure 100 defined by the region 312 of the covering layer 810 and the at least one useful structure 814 defined by the region 310 of the covering layer 810 remain. An etching process, in particular a dry etching process (such as, e.g., a plasma etching process) is preferably employed for patterning the starting layer 806. By simultaneously forming the at least one auxiliary structure 100 and the at least one useful structure 814, the advantages described regarding a longer lifetime, a higher dielectric strength and an improved electrical behavior of the device can be realized since an under-etching of the etching edge 816 in the environment of the useful structure side edge 818 and a damage of the upper layer 802 in the environment of the useful structure side edge 818 are minimized by forming the auxiliary structure 100. The structure resulting after this process step is illustrated in FIG. 3C.

Subsequently, the at least one unused region 310 of the covering layer 810 and the at least one unused region 312 of the covering layer 810 are removed so that the result is a structure as is illustrated in FIG. 3D.

Figure 3E:
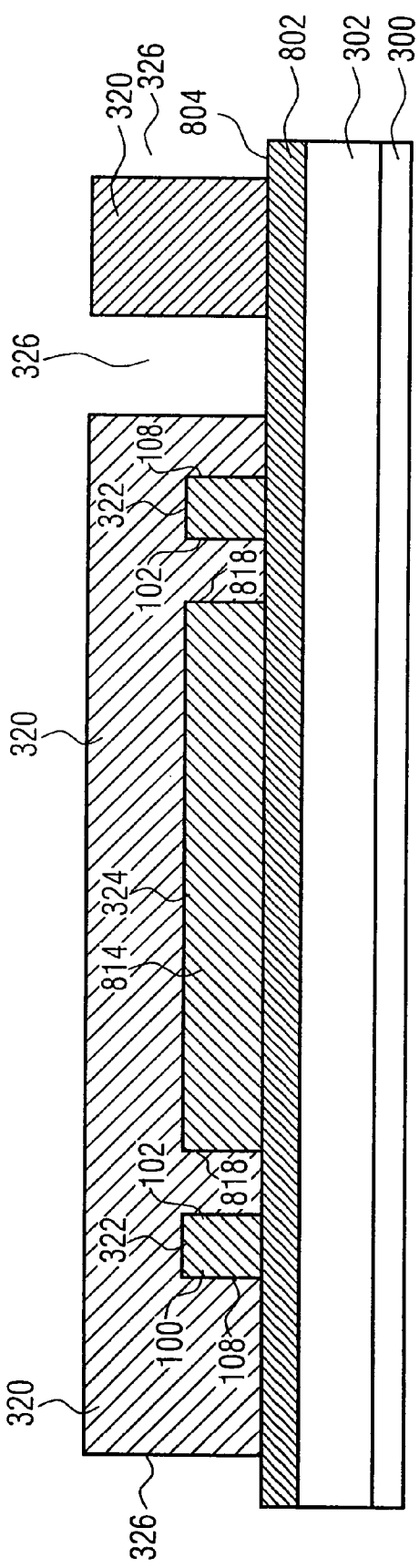

In a subsequent method step, another covering layer 320 is deposited on the surface 804 of the upper layer 802, the outer auxiliary structure side edge 108, the surface 322 of the auxiliary structure 100, the auxiliary structure side edge 102 opposite to the useful structure side edge 818, the useful structure side edge 818 and the surface 324 of the useful structure 814. In addition, the further covering layer 320 is patterned in such a way that in at least one region 326 in which the device to be formed is to be separated from neighboring devices, the surface 304 of the upper layer 302 is exposed. The structure resulting after this process step is illustrated in FIG. 3E.

Figure 3F:
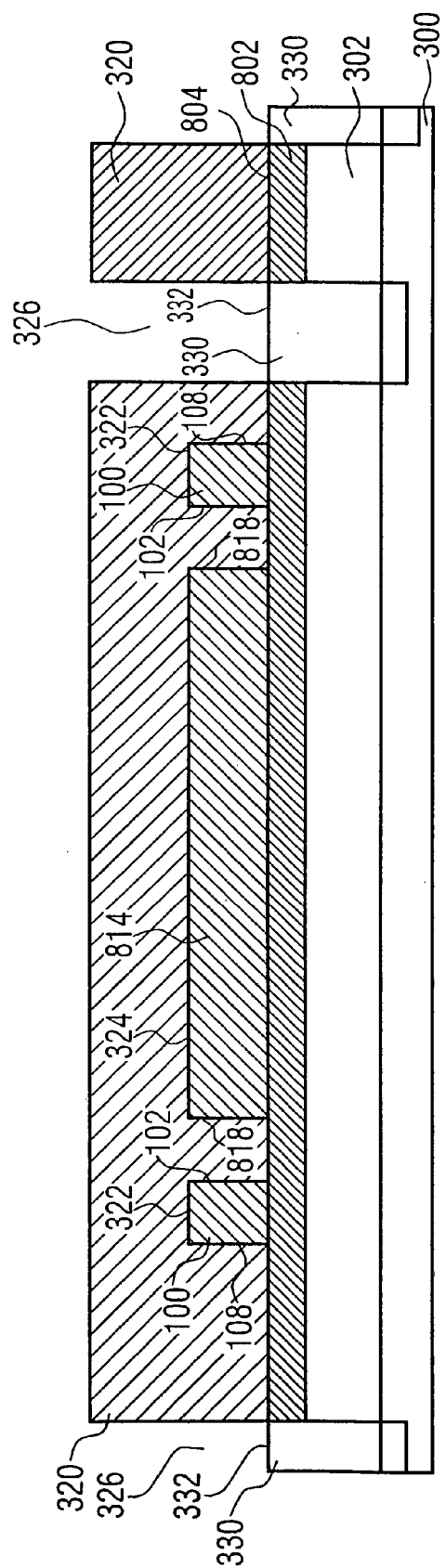

In a subsequent method step, insulation of the device from neighboring devices takes place at the at least one separation region 326 of the device, wherein the upper layer 802 and the first base layer 302 and a region of the ground layer 300 are removed in the separation region 326 in such a way that an electrically conducting connection is interrupted in the separation region 326 by an opening to be formed (trench structure 330 having an upper trench edge 332). The structure resulting after this process step is shown in FIG. 3F.

Figure 3G:
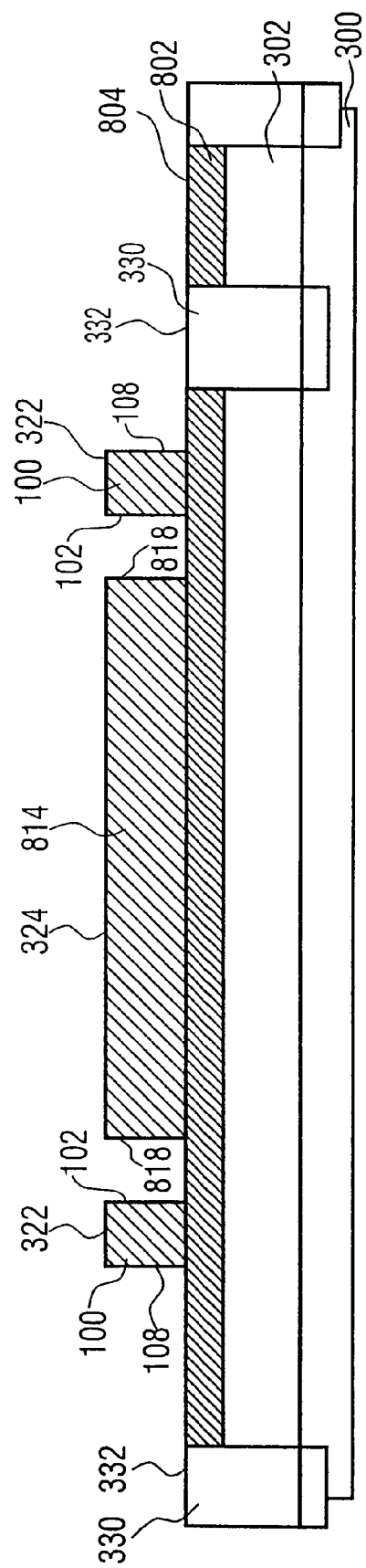

The further covering layer 320 is removed in a subsequent method step so that the structure shown in FIG. 3G results.

FIG. 3H, in a lower partial illustration, shows the structure of an inventive device resulting after the last process step in a sectional view, wherein it is shown in an addition plan view arranged above it how the useful structure 814 formed is surrounded by the auxiliary structure 100 formed.

A third preferred embodiment of the present invention which basically is based on the structure shown in FIG. 3G is illustrated in FIG. 4 in a section view. As a limitation, a useful structure 814 and an auxiliary structure 100 are assumed for the third preferred embodiment, which includes a conductive material, preferably a metallic material. In addition, the useful structure 814 includes at least one contact 400 in order to provide the useful structure with a potential. Furthermore, the device comprises a contact 402 for contacting the first base layer 302 including a conductive material, preferably a metallic material. By this, a metal isolator metal capacitor (MIMCAP) in integrated technology is formed utilizing the conductive first base layer 302, the upper layer 802 which preferably includes an insulating or dielectric material and the useful structure 814. In addition, in the third preferred embodiment of the present invention, the auxiliary structure 100 comprises a contact 404 to provide the auxiliary structure 100 with a potential. According to the third preferred embodiment of the present invention, the contact 404 of the auxiliary structure and the contact 402 of the first base layer 302 and connected in an electrically conductive way. Thus, it is possible to put the auxiliary structure 100 to basically the same potential as the first base layer 302. Such an arrangement offers advantages for employing the device in high-frequency technological applications.

Figure 5:
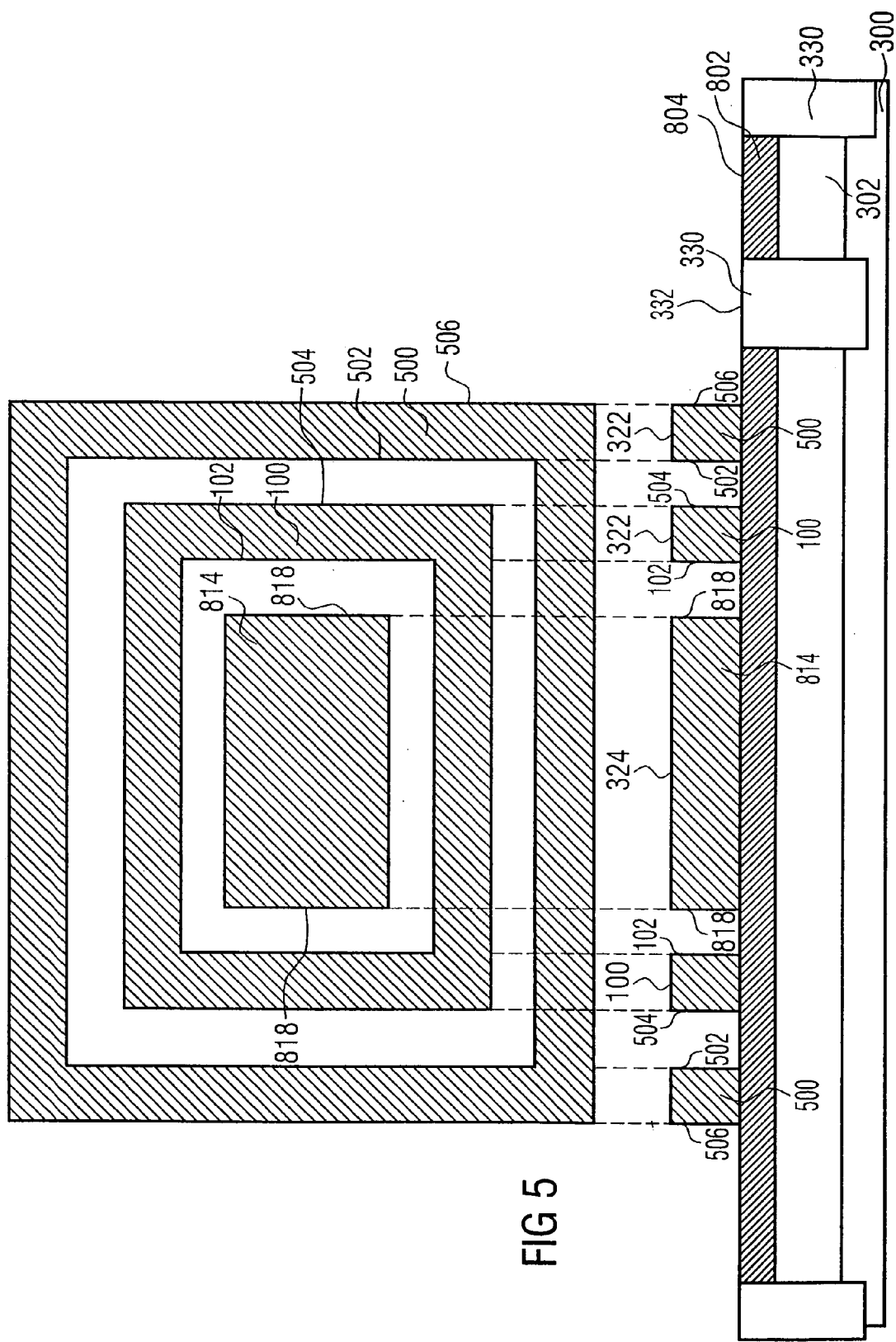
FIG. 5 shows a fourth preferred embodiment of the inventive device in a sectional view.

A fourth preferred embodiment of the present invention is shown in FIG. 5 in a sectional illustration in a lower partial illustration and as a plan view in an upper partial illustration. As a supplement to a device having a structure according to FIG. 3G, a further auxiliary structure 500 is arranged adjacent thereto in the fourth preferred embodiment of the present invention of the auxiliary structure 100, wherein the distance between the auxiliary structure 100 and the further auxiliary structure 500, within a tolerance range, corresponds to the distance 204 between a useful structure 814 and an auxiliary structure 100. The further auxiliary structure 500 here comprises an auxiliary structure side edge 502 which is opposed to an auxiliary structure side edge 504 of the auxiliary structure 100. In addition, the further auxiliary structure 500 comprises an outer auxiliary structure side edge 506 which is exposed to an isotropic etching attack unprotected. A more uniform formation of the auxiliary structure 100 and, consequently, a still optimized formation of the useful structure 814 can be achieved by forming a further auxiliary structure 500.

According to a fifth preferred embodiment of the present invention illustrated in FIG. 6, the auxiliary structure 100 includes a plurality of useful sub-structures 600 separated from one another, which are separated from one another by a distance 602. Here, the distance 603 between the auxiliary structure 100 and the useful sub-structures 600, within a tolerance range, corresponds to the distance 602 between the sub-useful structures 600. Here the tolerance range includes a deviation of 10% of the distance 602 between the useful sub-structures 600. The arrangement of the useful sub-structures 600 can again be referred to as a useful structure field. By arranging the auxiliary structure 100, the formation of the individual useful sub-structures 600 of the useful structure field can thus be influenced in such a way that the side edges 818 arranged at the outer margin region of the useful structure field and the etching edge 816 of the useful sub-structure 600 arranged at the outer margin range of the useful structure field have geometrical dimensions basically corresponding to the geometrical dimensions of a useful structure side edge 904 and of an etching edge 906 arranged within the useful structure field. The basically equal dimensions of the useful structure side edge 818 and of the etching edge 816 at the outer margin range of the useful structure field regarding the useful structure side edge 904 and the etching edge 906 within the useful structure field result from arranging the auxiliary structure 100 with essentially the same spatial environmental conditions for the etching process for forming the useful structure side edges (818, 904) and the etching edges (816, 906) at the margin region and within the useful structure field. A more homogenous electrical behavior of the useful sub-structure 600 results in the margin regions of the useful structure field, wherein a longer lifetime, an increased dielectric strength and a reduced early failure rate of the devices formed by the useful structures can be realized additionally.

Figure 7A:
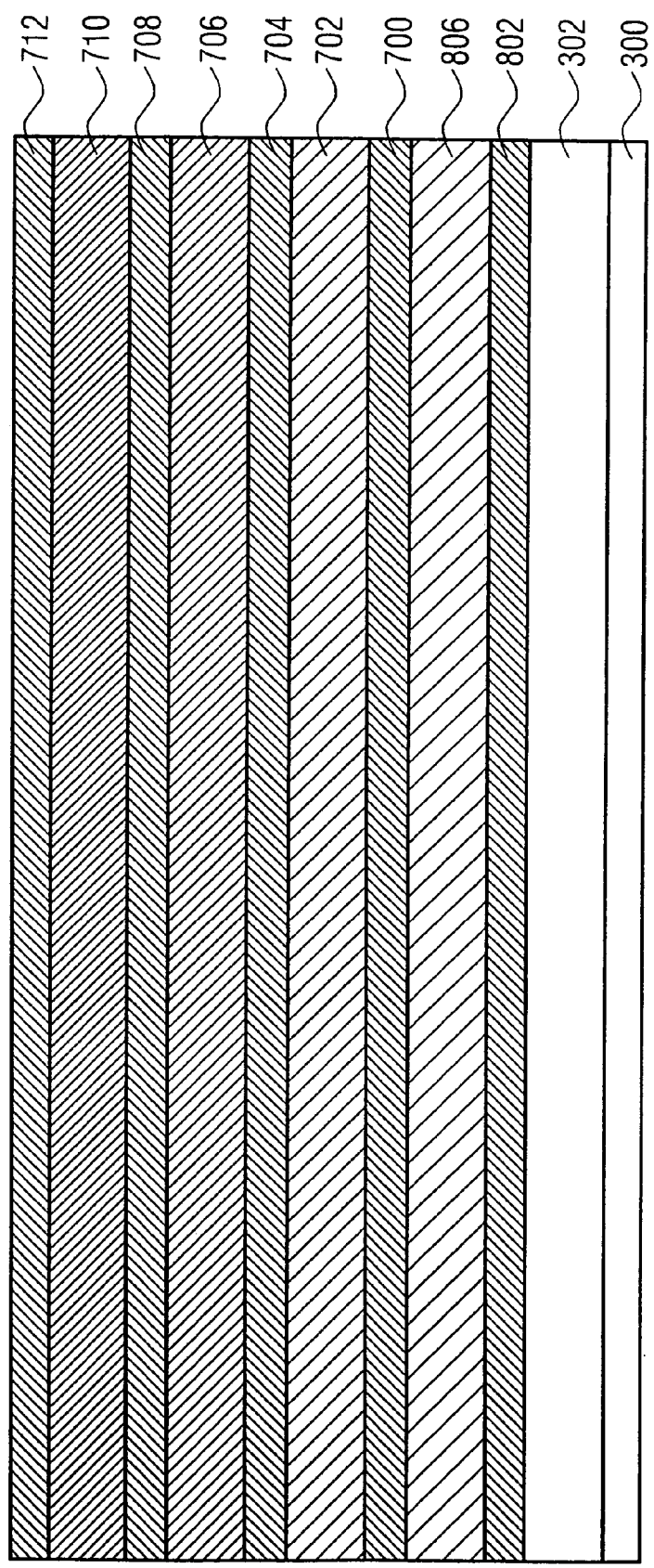

According to a second preferred embodiment of the present invention, a device is produced, in which a plurality of useful structures and auxiliary structure arranged adjacent thereto are arranged on a ground layer 300 in a plurality of sheets. A layered starting material, as is preferably used for producing the device, is illustrated in FIG. 7A. A first base layer 302 which preferably includes a conductive material, in particular an electrical material, is at first arranged on the ground layer 300. An upper layer 802 which preferably includes an insulating or dielectric material is arranged on the first base layer 302. A starting layer 806 which preferably includes a conductive material, in particular a metallic material, is arranged on the upper layer 802. A first separating layer 700 on which in turn a second base layer 702 is arranged, is deposited on the starting layer 806. A second separating layer 702, on which in turn a third base layer 706 is arranged, is located on the second base layer 702. A third separating layer 708, which is covered by a fourth base layer 710 is arranged on the third base layer 706. A fourth separating layer 712 is finally deposited on the fourth base layer 710. Here, in particular the first separating layer 700, the second separating layer 704, the third separating layer 708 and the fourth separating layer 712 preferably include an insulating or dielectric material. In addition, the second base layer 702, the third base layer 706 and the fourth base layer 710 preferably include an electrically conductive, in particular a metallic material. It can be seen from this that for forming the device, a starting material is used which uses five conductive layers arranged one above the other which are separated by insulating or dielectric layers. When a conductive layer with an overlying insulating or dielectric layer, as a summary, is referred to as a sheet, the result is a five-sheet starting material as is shown in FIG. 7A.

In a subsequent method step, a first patterning layer 714, such as, for example, a photo-sensitive resist, is deposited on the first separating layer 712 and patterned such that the first auxiliary structure is defined by a region 716 of the first patterning layer 714 and a first useful structure is defined by a region 718 of the first patterning layer 714. The structure resulting after this process step is illustrated in FIG. 7B.

In a subsequent method step which preferably takes place by an etching process, a first auxiliary structure 720 is formed using the region 716 of the first patterning layer 714 and a first useful structure 722 is formed using the region 718 of the first patterning layer 714 in the second base layer 702. Here, a medium is used which removes those regions of the fourth separating layer 712, the fourth base layer 710, the third separating layer 708, the third base layer 706 and the second separating layer 704, the removal of which has been defined by the region 716 and the region 718 of the patterned first patterning layer 714. The removal by the medium thus selectively stops at the first separating layer 700 and thus exposes partial regions of the surface of the first separating layer 700. The structure resulting after this process step is illustrated in FIG. 7C.

Figure 7D:
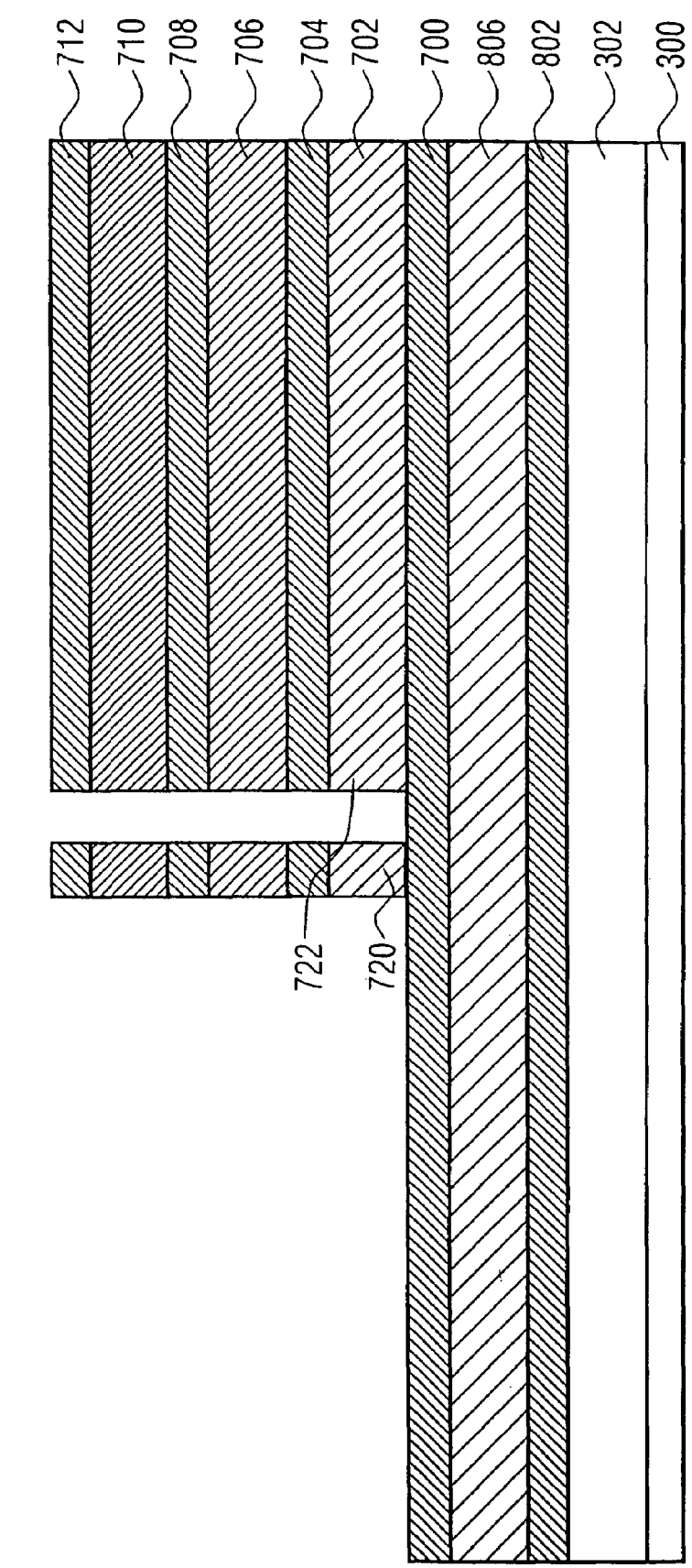

By removing the patterned first unused patterning layer 714, those areas of the surface of the fourth separating layer 712 are exposed, which have been covered by the region 716 of the first patterning layer 714 for defining the auxiliary structure 720 and the region 718 of the first patterning layer 714 for defining the useful structure 722 so that the structure results which is illustrated in FIG. 7D.

In a subsequent method step, a second patterning layer 730, for example again a photo-sensitive resist, is deposited on the exposed surface of the fourth separating layer 712 and the exposed surface of the first separating layer 700. In addition, the second patterning layer 730 is structured such that on the surface of the fourth separating layer 712 only a region 732 of the second patterning layer 730 for defining a second auxiliary structure and a region 734 of the second patterning layer 730 for defining the second useful structure remain. Furthermore, the second patterning layer 730 deposited on the surface of the first separating layer 700 is patterned such that a region 736 on the surface of the first separating layer 700 is exposed to define a separating region of the device. The structure resulting after this process step is illustrated in FIG. 7E.

Figure 7F:
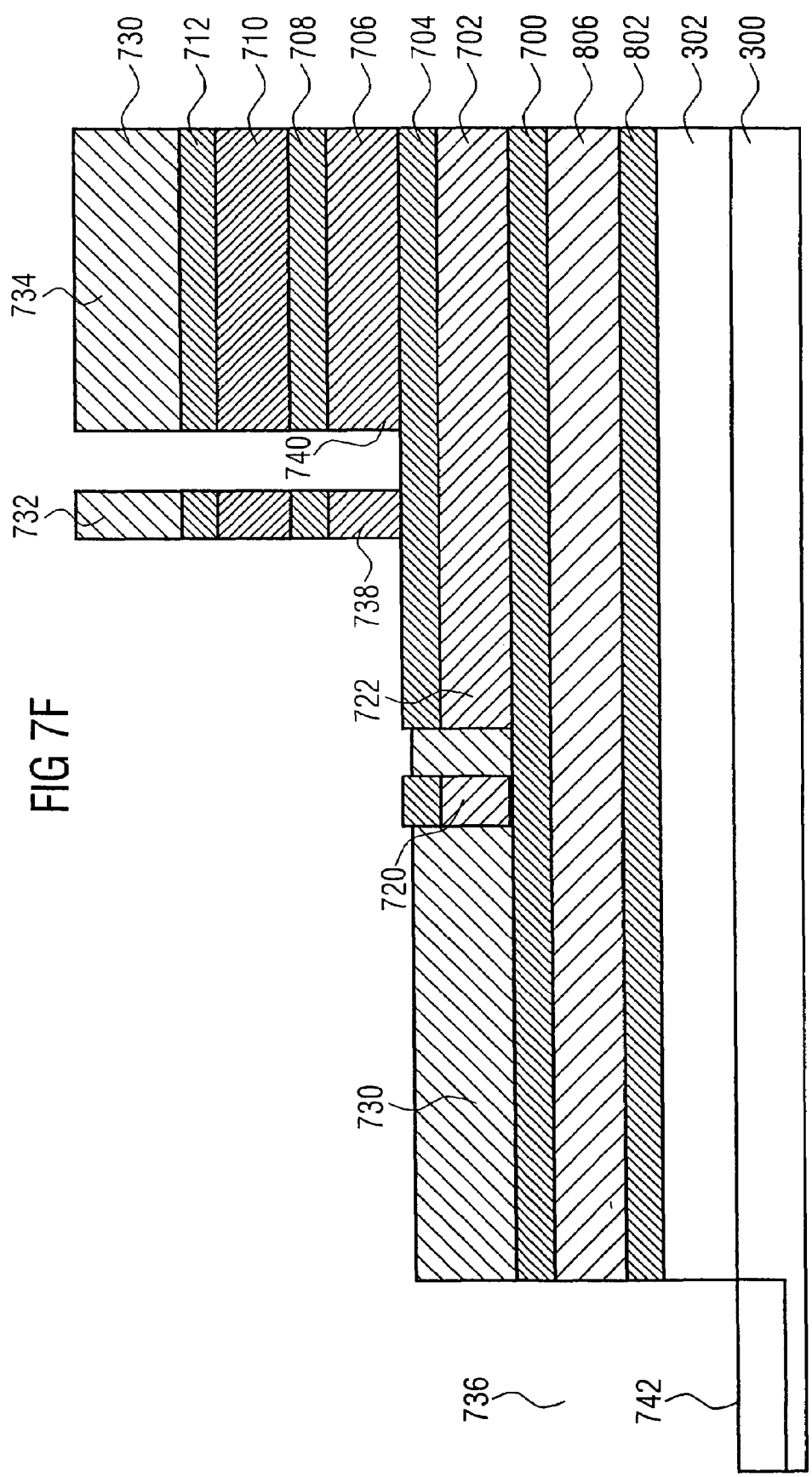

By a subsequent patterning, preferably by applying an etching method, a second auxiliary structure 738 and a second useful structure 740 are formed in the third base layer 706 by using a medium for patterning which removes those regions of the fourth separating layer 712, the fourth base layer 710, the third separating layer 708 and the third base layer 706, which are basically arranged perpendicularly below the exposed regions of the fourth separating layer 712. In addition, a separating region 742 of the device is exposed by patterning on the surface of the ground layer by removing, by patterning, those regions of the first separating layer 700, the starting layer 806, the upper layer 802 and the first base layer 302, which are arranged perpendicularly below the region 736 on the surface of the first separating layer 700, wherein the region 736 defines the separating region of the device. The erosion of layers by the medium used in this process step stops at the second separating layer 704 and in the ground layer 300 (i.e. it is selective as regards the second separating layer 704 and less selective as regards the ground layer 300), whereby a region of the second separating layer 704 and a region of the ground layer 300 are exposed. The erosion by the medium used will end at 704. The structure resulting after this process step is illustrated in FIG. 7F.

Figure 7G:
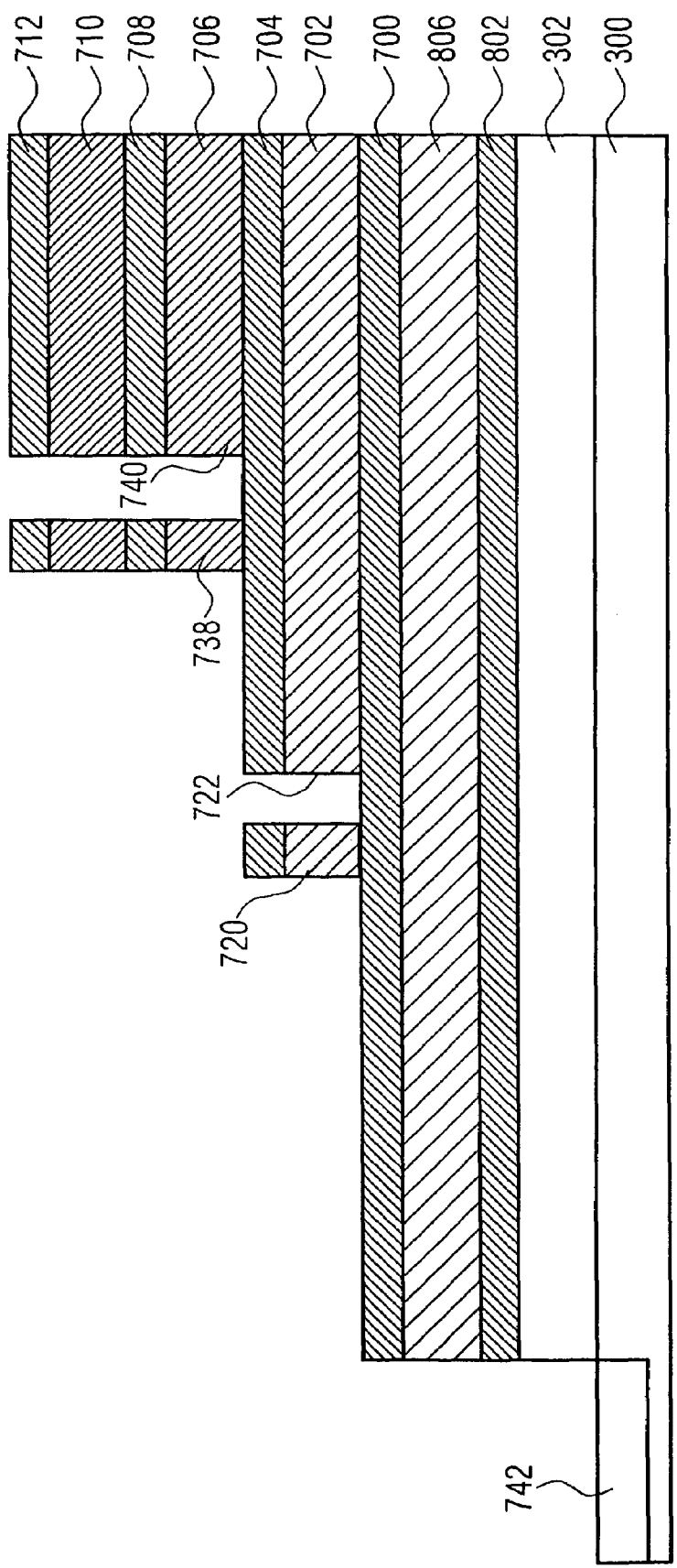

By subsequently removing the patterned second unused patterning layer 730, those regions of the first separating layer 700 and of the fourth separating layer 712 are exposed, which have been covered by the patterned second covering layer 730. The structure resulting after this process step is illustrated in FIG. 7G.

Figure 7H:
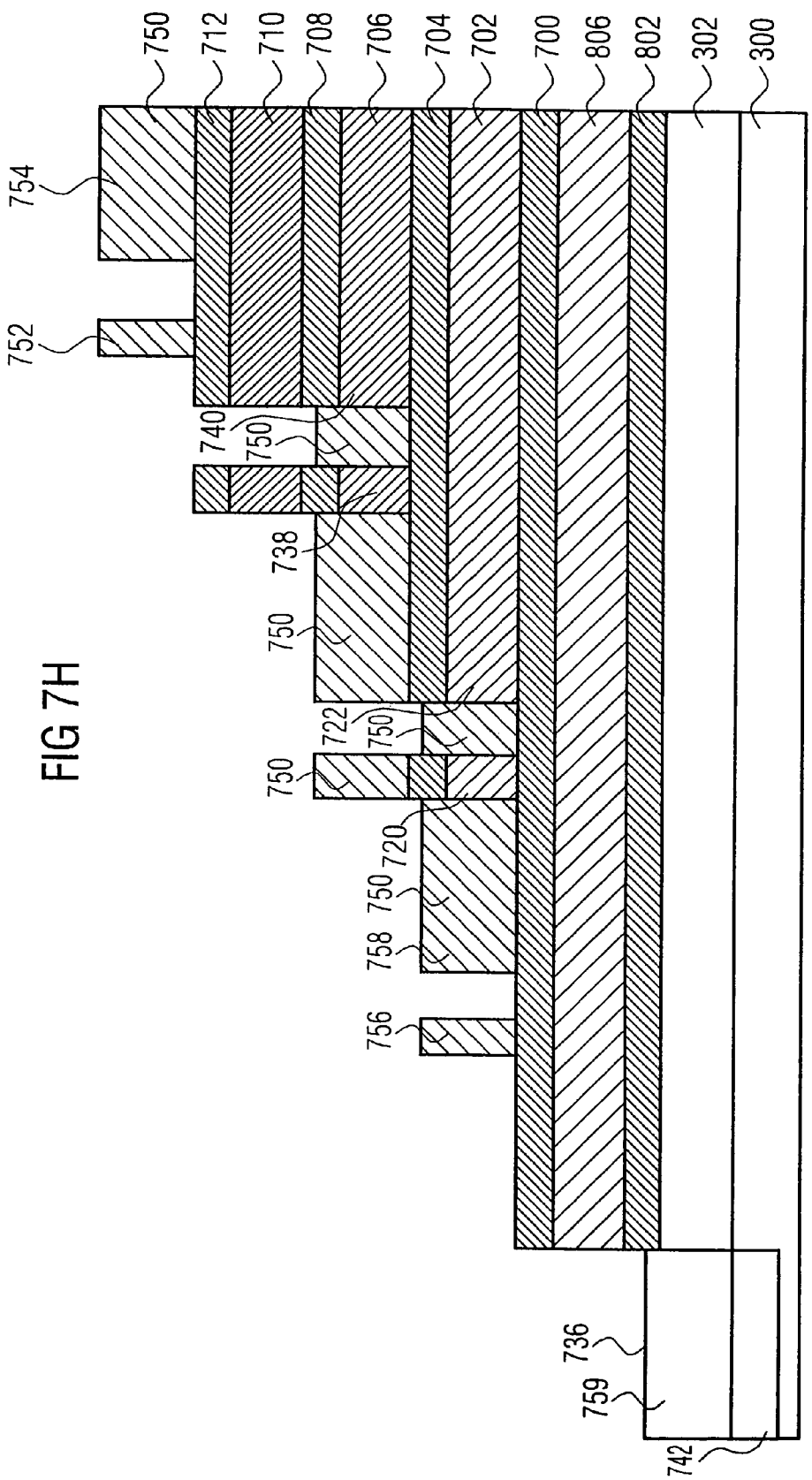
Figure 71:
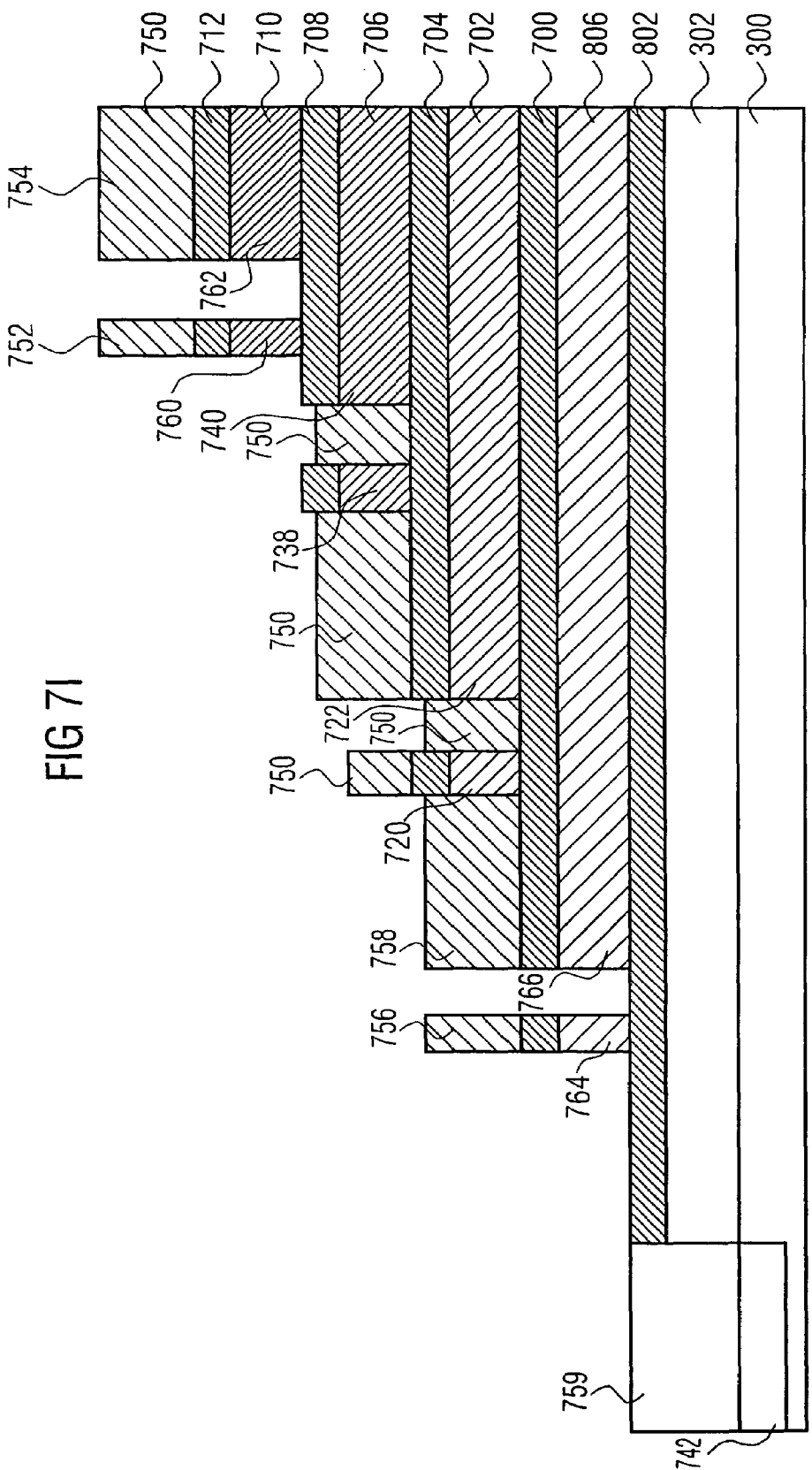

The deposition of a third patterning layer 750, such as, for example, a photo-sensitive resist, onto the exposed surface of the fourth separating layer 712, the exposed surface of the second separating layer 704 and the exposed surface of the first separating layer 700 follows in a subsequent method step. In addition, the third patterning layer 750 is patterned such that a region 752 of the third patterning layer 750 on the fourth separating layer 712 defines a third auxiliary structure, a region 754 of the third patterning layer 750 on the fourth separating layer 712 defines a third useful structure which is opposite to the third auxiliary structure, a region 756 of the third patterning layer 750 on the first separating layer 700 defines a fourth auxiliary structure, a region 758 of the third patterning layer 750 on the first separating layer 700 defines a fourth useful structure opposite to the fourth auxiliary structure and a region 759 of the third patterning layer 750 on the ground layer 300 defines a fifth useful structure. The structure resulting after patterning the third patterning layer 750 is illustrated in FIG. 7H.

In a subsequent method step, the third auxiliary structure 760 and the third useful structure 762 are formed, using the patterned third patterning layer 750, in the fourth base layer 710 and the fourth auxiliary structure 764 and the fourth useful structure 766 are formed in the starting layer 806, preferably by an etching process. Here, for forming the auxiliary structures (760, 764) and the useful structures (762, 766) a medium is used which is selective as regards the third separating layer 706 and at the same time selective as regards the upper layer 802, i.e. an erosion of regions of the first separating layer 700, the starting layer 806, the fourth separating layer 712 and the fourth base layer 710, defined by the patterned third patterning layer 750, by the medium takes place such that the erosion is stopped by the upper layer 802 and the third separating layer 708. The structure resulting after this process step is illustrated in FIG. 7I.

Figure 7J:
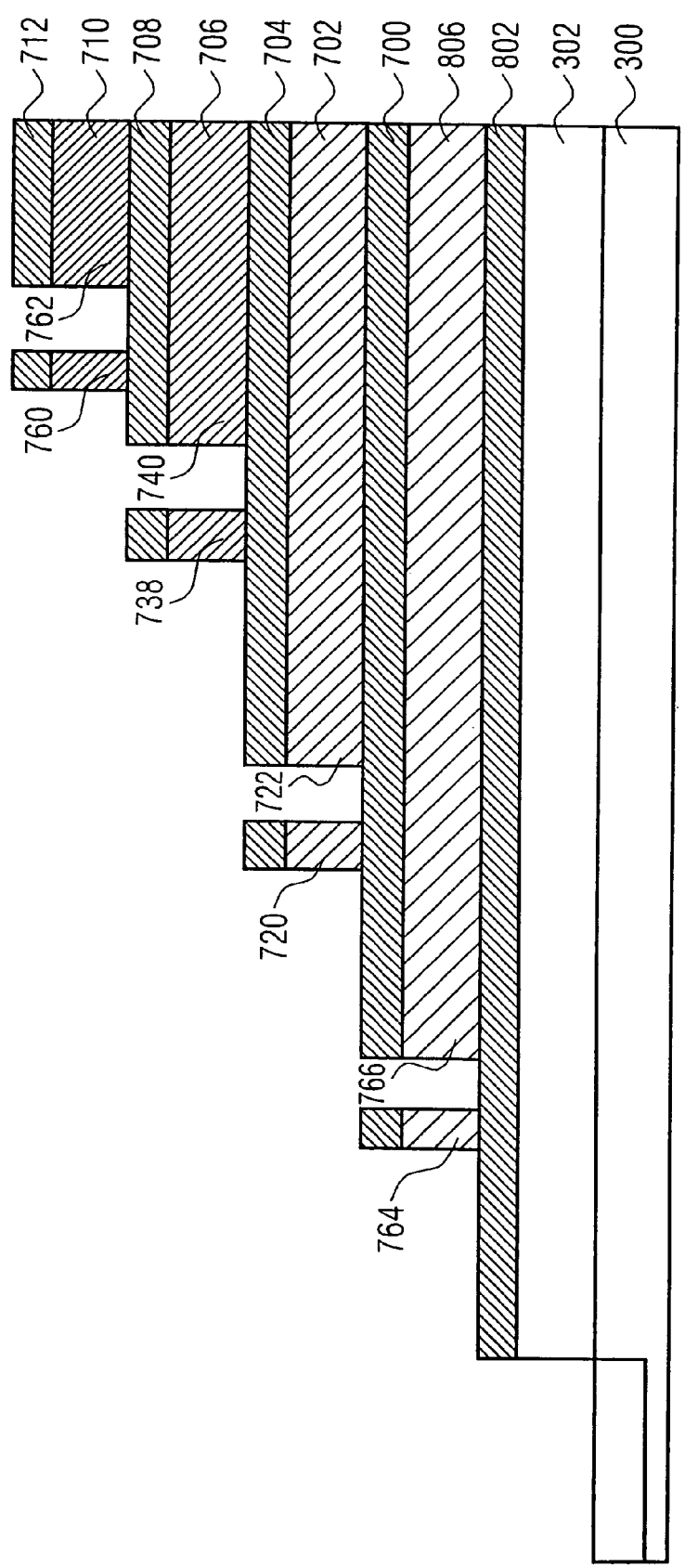
Figure 8:
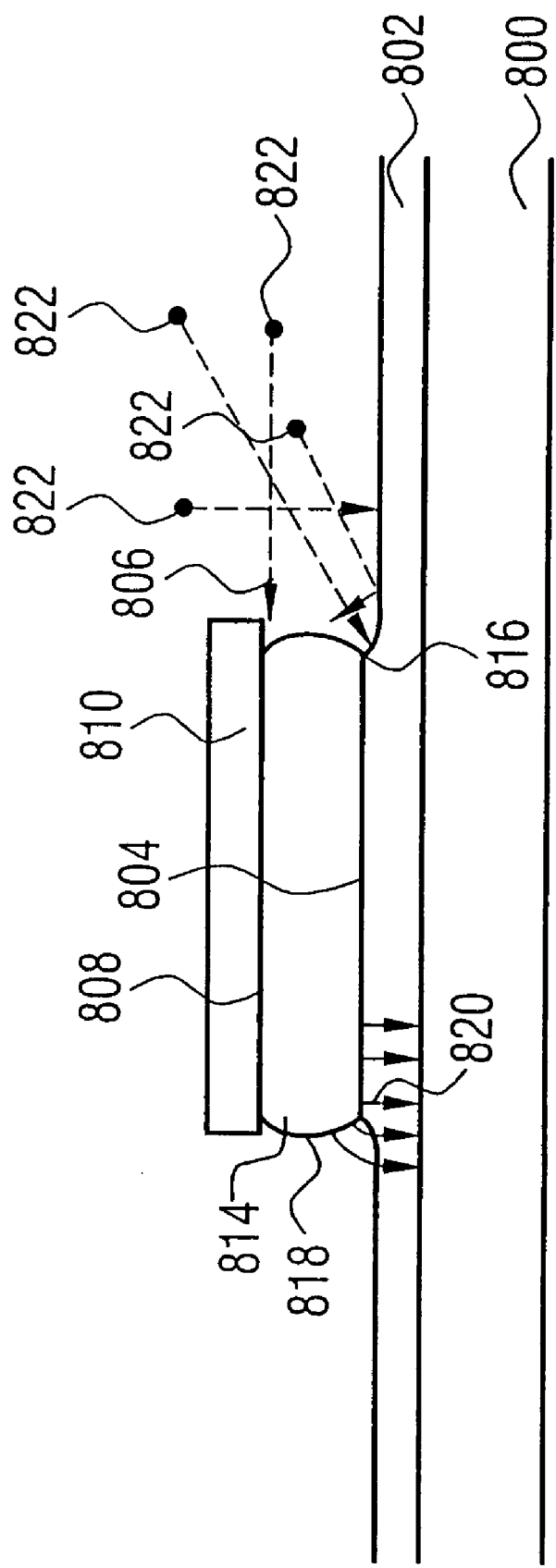
FIG. 8 shows a device manufactured by a method according to the prior art in a sectional view.

A subsequent removal of the patterned third patterning layer 750 results in the structure illustrated in FIG. 7J.

In order to produce a capacity having several electrodes arranged above one another (stacked MIMCAP) from the structure illustrated in FIG. 7J, the first base layer 302 is provided with a contact 780, the first useful structure 722 is provided with a contact 782, the second useful structure 740 is provided with a contact 784, the third useful structure 762 is provided with a contact 786 and the fourth useful structure 766 is provided with a contact 788 in a subsequent process step. By this, it is possible to impress a respective different potential onto the individual useful structures (722, 740, 760, 766) or onto the first base layer 302, since the individual useful structures (722, 740, 760, 766) or the first base layer 302 are electrically separated from one another. For forming the stacked MIMCAP, the contact 780 of the first base layer 302, the contact 782 of the first useful structure 722 and the contact 786 of the third useful structure 762 are connected in an electrically conducting way via a first contact 790. In addition, the contact 788 of the fourth useful structure 766 and the contact 786 of the second useful structure 740 are connected to each other in an electrically conductive way by means of a second contact 792. The structure resulting after this process step is illustrated in FIG. 7K. By connecting the contacts of the useful structures in an electrically conductive way, as has been mentioned, a structure of the MIMCAP can be realized in which pairs of opposing useful structures can be provided with a different potential with respect to each other. It is possible by such an inter-digital structure to realize a capacitor having a high capacity in integrated technology with a small area consumption and a low defect density.

In order to be able to produce such a stacked MIMCAP structure with a sufficient degree of precision, a highly precise formation of the side edges of the useful structures (722, 740, 760, 766) and, in particular, of the etching edges between the useful structures (722, 740, 760, 766) and the underlying separating layers (700, 704, 708) is required. Since in particular the formation of the useful structures preferably takes place by an etching process, wherein an etching step partially includes removing a region over several layers, a high anisotropy, i.e. a high directivity, is particularly required in such an etching step. Here, such an anisotropic etching process can particularly be ensured by forming a respective auxiliary structure which is arranged in a distance to the useful structure concerned. The formation of an auxiliary structure arranged adjacent to a useful structure in a respective distance, thus makes it possible to form a defined side edge of the useful structure or the etching edge of the useful structure in a highly precise way and thus considerably contributes to a longer lifetime, a higher dielectric strength and a more precise adjustability of the electrical behavior and, in particular, a small tolerance range of the MIMCAP produced.

Although preferred embodiments of the present invention have been detailed hereinbefore, it is obvious that the present invention is not limited to those embodiments. It is to be mentioned in particular that the auxiliary structure does not exclusively completely include a useful structure to be formed. By arranging or forming an auxiliary structure, only sections of the useful structure which are particularly relevant for the functionality of the device may be protected. Furthermore, it can be mentioned that the usage of an auxiliary structure is not limited to devices by which a capacity can be realized in integrated technology. An auxiliary structure can preferably be employed to particular advantage when a side edge of a useful structure is to be protected from an isotropic etching attack.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device comprising:
an electrode arranged on a substrate and comprising an electrode side edge; and
an auxiliary structure arranged on the substrate adjacent to the electrode and comprising an auxiliary structure side edge, wherein the electrode side edge is opposite to the auxiliary structure side edge separated by a first distance, and wherein the first distance is dimensioned in such a way that at least one of the group of a form of the electrode side edge or a form of the substrate next to the electrode side edge differs from a form of a corresponding element in a device in which there is no auxiliary structure, wherein the electrode is electrically isolated from the auxiliary structure;
wherein a plurality of electrodes are adjacent on the substrate, at least one electrode separated from an adjacent electrode by a second distance, the first distance within a predetermined tolerance range of the second distance, and
wherein the tolerance range includes a deviation of 10% of the second distance.

2. The device according to claim 1, wherein the plurality of electrodes form a field of electrodes, wherein the electrode arranged opposite to the auxiliary structure is arranged at a margin of the field.

3. The device according to claim 1, wherein the auxiliary structure surrounds a set of at least one electrode including the electrode.

4. The device according to claim 1, wherein the electrode comprises an electrical functionality having a useful characteristic.

5. The device according to claim 1, wherein the auxiliary structure is conductive and comprises a terminal contact for providing the auxiliary structure with a potential.

6. The device according to claim 1, wherein the substrate includes an upper layer on which the electrode and the auxiliary structure are arranged.

7. The device according to claim 6, wherein the upper layer of the substrate includes a dielectric.

8. The device according to claim 1, wherein a plurality of sets of electrodes and auxiliary structures arranged adjacent thereto are arranged on the substrate in a plurality of sheets, wherein a sheet includes a separating layer, the electrode and the auxiliary structure arranged adjacent to the electrode, wherein the electrode and the auxiliary structure are arranged on the separating layer.

9. The device according to claim 8, wherein the material of the separating layer includes an insulating material.

10. A device comprising:
an electrode arranged on a substrate and comprising a electrode side edge; and
an auxiliary structure arranged on the substrate adjacent to the electrode and comprising an auxiliary structure side edge, wherein the electrode side edge is opposite to the auxiliary structure side edge separated by a first distance, and wherein the first distance is dimensioned in such a way that at least one of the group of a form of the electrode side edge or a form of the substrate next to the electrode side edge differs from a form of a corresponding element in a device in which there is no auxiliary structure, wherein the electrode is electrically isolated from the auxiliary structure, wherein the auxiliary structure comprises an auxiliary structure height and the electrode comprises an electrode height, wherein the auxiliary structure height, within a tolerance range, equals the electrode height.

11. The device according to claim 10, wherein a plurality of electrodes are arranged at different locations on the substrate, each electrodes adjacent to the auxiliary structure and separated from the auxiliary structure by a distance that is within the tolerance range of the second distance.

12. The device according to claim 10, wherein the tolerance range includes a deviation of 10% of the electrode height.

13. The device according to claim 10, wherein the auxiliary structure is conductive and comprises a terminal contact for providing the auxiliary structure with a potential.

14. The device according to claim 10, wherein a plurality of sets of electrodes and auxiliary structures arranged adjacent thereto are arranged on the substrate in a plurality of sheets, wherein a sheet includes a separating layer, the electrode and the auxiliary structure arranged adjacent to the electrode, wherein the electrode and the auxiliary structure are arranged on the separating layer.

15. The device according to claim 14, wherein the material of the separating layer includes an insulating material.

16. A device comprising:
an electrode arranged on a substrate and comprising an electrode side edge; and
an auxiliary structure arranged on the substrate adjacent to the electrode and comprising an auxiliary structure side edge, wherein the electrode side edge is opposite to the auxiliary structure side edge separated by a distance, and wherein the distance is dimensioned in such a way that a form of the electrode side edge or a form of the substrate next to the electrode side edge differs from a form in a device in which there is no auxiliary structure, wherein the electrode is electrically isolated from the auxiliary structure, wherein the substrate comprises a metal region and an insulating layer on the metal region, wherein the electrode and the auxiliary structure are arranged on the insulating layer and include a metallic material so that the electrode, the insulating layer and the metal region form a metal isolator metal capacitor, and wherein the auxiliary structure is connected to the metal region in an electrically conducting way.

17. The device according to claim 16, wherein a plurality of sets of electrodes and auxiliary structures arranged adjacent thereto are arranged on the substrate in a plurality of sheets, wherein a sheet includes a separating layer, the electrode and the auxiliary structure arranged adjacent to the electrode, wherein the electrode and the auxiliary structure are arranged on the separating layer.

18. The device according to claim 17, wherein the material of the separating layer includes an insulating material.

19. A device comprising:
an electrode arranged on a substrate and comprising an electrode side edge; and
an auxiliary structure arranged on the substrate adjacent to the electrode and comprising an auxiliary structure side edge, wherein the electrode side edge is opposite to the auxiliary structure side edge separated by a first distance, and wherein the first distance is dimensioned in such a way that a form of the electrode side edge or a form of the substrate next to the electrode side edge differs from a form in a device in which there is no auxiliary structure, wherein the electrode is electrically isolated from the auxiliary structure, wherein an additional auxiliary structure is adjacent to the auxiliary structure, wherein a second distance between the auxiliary structure and the additional auxiliary structure, within a tolerance range, corresponds to the first distance.

20. The device according to claim 19, wherein the tolerance range includes a deviation of 20% of the first distance.

21. The device according to claim 19, wherein the auxiliary structure is conductive and comprises a terminal contact for providing the auxiliary structure with a potential.

* * * * *